(12) United States Patent
Oh et al.

(10) Patent No.: US 12,114,456 B2
(45) Date of Patent: Oct. 8, 2024

(54) MOUNTING BRACKET

(71) Applicant: ERICO International Corporation, Solon, OH (US)

(72) Inventors: Michael Hung-Sun Oh, Twinsburg, OH (US); Kevin Jacobs, Cuyahoga Falls, OH (US)

(73) Assignee: ERICO International Corporation, Solon, OH (US)

( * ) Notice: Subject to any disclaimer, the term of this patent is extended or adjusted under 35 U.S.C. 154(b) by 181 days.

(21) Appl. No.: 17/443,558

(22) Filed: Jul. 27, 2021

(65) Prior Publication Data

US 2022/0030731 A1 Jan. 27, 2022

Related U.S. Application Data

(60) Provisional application No. 63/057,002, filed on Jul. 27, 2020.

(51) Int. Cl.
*H05K 7/14* (2006.01)
*H05K 7/00* (2006.01)

(52) U.S. Cl.
CPC .................. *H05K 7/14* (2013.01); *H05K 7/00* (2013.01)

(58) Field of Classification Search
CPC ............ H02G 3/12; H02G 3/125; H02G 3/32; H02G 3/083; H02G 3/123; H02G 3/126; H02G 1/00; E04B 9/06; E04B 2001/405; Y10S 248/9206; B60T 17/046; F16L 3/24; F16B 2/20
See application file for complete search history.

(56) References Cited

U.S. PATENT DOCUMENTS

| 1,206,431 | A |   | 11/1916 | Graybill |
| 1,113,092 | A |   | 1/1917  | Kruse |
| 1,211,182 | A | * | 1/1917  | Kruse ....................... G09F 7/18 |
|           |   |   |         | 220/3.9 |
| 1,982,957 | A | * | 12/1934 | Knell ...................... H02G 3/126 |
|           |   |   |         | 220/3.9 |
| 4,561,516 | A |   | 12/1985 | Bishop et al. |
| 4,863,399 | A | * | 9/1989  | Medlin, Jr. ............ H02G 3/125 |
|           |   |   |         | 439/538 |

(Continued)

OTHER PUBLICATIONS

Product sheet for Low Voltage Mounting Plate for New Construction—MP1S, nVent, 2020.

(Continued)

*Primary Examiner* — Nkeisha Smith
(74) *Attorney, Agent, or Firm* — Quarles & Brady LLP

(57) ABSTRACT

A mounting bracket is provided for an electrical device that can be configured for use with a support that has a first and a second rail. The mounting bracket can include a mounting body with a mounting face configured to secure the electrical device to the mounting bracket between the first and second rails when the mounting bracket is secured to the support. The mounting bracket can include a first attachment device connected to the mounting body and a second attachment device connected to the mounting body opposite the first attachment device. Each of the first and second attachment devices can include a first arm configured to engage with a first side of the corresponding first or second rail, and a second arm configured to engage with a second side of the corresponding rail, opposite the first arm.

20 Claims, 34 Drawing Sheets

(56) References Cited

U.S. PATENT DOCUMENTS

| | | | |
|---|---|---|---|
| 4,964,525 A | 10/1990 | Coffey et al. | |
| 5,005,792 A | 4/1991 | Rinderer | |
| 5,448,011 A | 9/1995 | Laughlin | |
| 5,595,362 A | 1/1997 | Rinderer et al. | |
| 5,598,998 A | 2/1997 | Lynn | |
| 5,646,371 A | 7/1997 | Fabian | |
| 5,682,017 A | 10/1997 | Marrotte | |
| D427,889 S | 7/2000 | Gretz | |
| 6,227,499 B1 | 5/2001 | Jennison et al. | |
| 6,376,770 B1 | 4/2002 | Hyde | |
| 6,384,334 B1 | 5/2002 | Webb | |
| 6,452,098 B1 | 9/2002 | Gretz | |
| 6,452,813 B1 | 9/2002 | Gretz | |
| 6,710,245 B2 | 3/2004 | Roesch et al. | |
| 6,812,405 B1 | 11/2004 | Hull et al. | |
| 6,857,903 B2 | 2/2005 | Hyde | |
| 6,870,101 B1 | 3/2005 | Hull et al. | |
| 6,872,884 B2 | 3/2005 | Roesch et al. | |
| 6,940,017 B2 | 9/2005 | Roesch et al. | |
| 7,053,300 B2* | 5/2006 | Denier | H02G 3/18 220/3.9 |
| D523,818 S | 6/2006 | Roesch et al. | |
| 7,112,743 B2 | 9/2006 | Hull et al. | |
| D533,139 S | 12/2006 | Roesch et al. | |
| D535,949 S | 1/2007 | Kiely | |
| D538,751 S | 3/2007 | Kiely | |
| D538,752 S | 3/2007 | Kiely | |
| D539,751 S | 4/2007 | Kiely | |
| 7,271,335 B2 | 9/2007 | Dinh | |
| 7,271,336 B2 | 9/2007 | Dinh | |
| 7,279,635 B2 | 10/2007 | Hyde | |
| 7,312,396 B1 | 12/2007 | Gorman | |
| 7,472,875 B2* | 1/2009 | Rinderer | H02G 3/125 248/200.1 |
| 7,521,631 B2 | 4/2009 | Dinh | |
| 7,549,549 B1 | 6/2009 | Kiely | |
| 7,572,977 B2 | 8/2009 | Gorman | |
| 7,659,477 B2 | 2/2010 | Korcz et al. | |
| 7,677,512 B1 | 3/2010 | Ford et al. | |
| D619,097 S | 7/2010 | McCarthy | |
| 7,798,458 B2 | 9/2010 | Borbolla et al. | |
| 7,910,828 B1 | 3/2011 | Shotey et al. | |
| 7,923,635 B2 | 4/2011 | Korcz et al. | |
| 7,946,091 B1 | 5/2011 | Wisniewski | |
| 7,956,285 B2 | 6/2011 | Tally et al. | |
| 8,072,779 B1 | 12/2011 | Haberek | |
| 8,250,773 B1 | 8/2012 | Shotey et al. | |
| 8,314,333 B1 | 11/2012 | Shotey et al. | |
| 8,328,150 B2 | 12/2012 | Collins et al. | |
| 8,403,289 B1* | 3/2013 | Rinderer | H02G 3/126 220/3.9 |
| 8,424,827 B2 | 4/2013 | Dinh | |
| RE44,546 E | 10/2013 | Gorman | |
| 8,680,394 B2* | 3/2014 | Korcz | H02G 3/20 174/67 |
| 8,702,446 B2 | 4/2014 | Gonzalez | |
| 8,921,714 B2 | 12/2014 | Haberek et al. | |
| RE45,430 E | 3/2015 | Gorman | |
| 9,048,640 B2 | 6/2015 | Gagne et al. | |
| 9,083,166 B2 | 7/2015 | Gagne et al. | |
| 9,209,611 B2 | 12/2015 | Gagne et al. | |
| 9,252,579 B2* | 2/2016 | Korcz | H02G 3/08 |
| 9,419,422 B2 | 8/2016 | Gonzalez | |
| 9,444,236 B2 | 9/2016 | Witherbee | |
| 9,502,874 B2* | 11/2016 | Gagne | H02G 3/14 |
| 9,559,504 B2* | 1/2017 | Jones | H02G 3/12 |
| 9,595,819 B1 | 3/2017 | Bonino | |
| 9,627,868 B2 | 4/2017 | Mominee et al. | |
| 9,653,899 B2* | 5/2017 | Salian | F16B 5/0016 |
| 9,780,545 B2 | 10/2017 | Witherbee | |
| 9,853,431 B2 | 12/2017 | Jones | |
| 10,069,288 B1 | 9/2018 | Link | |
| 10,077,866 B2* | 9/2018 | Witherbee | F16M 13/02 |
| 10,084,296 B2* | 9/2018 | Korcz | H02G 3/083 |
| D841,432 S | 2/2019 | Nikayin et al. | |
| 10,361,547 B2* | 7/2019 | Kellerman | H02G 3/125 |
| 10,923,895 B2* | 2/2021 | Korcz | H02G 3/16 |
| 11,248,740 B2* | 2/2022 | Witherbee | H02G 3/126 |
| 11,296,489 B2* | 4/2022 | Oh | H02G 3/081 |
| 11,473,721 B2* | 10/2022 | Oh | F16M 13/022 |
| 2010/0176138 A1* | 7/2010 | Zacharevitz | H02G 1/00 220/737 |
| 2010/0267278 A1 | 10/2010 | Gonzalez | |
| 2013/0312997 A1 | 11/2013 | Korte et al. | |
| 2019/0086025 A1 | 3/2019 | Witherbee | |

OTHER PUBLICATIONS

Product sheet for Carlon 663168 2-Gang Low-Voltage Mounting Bracket, https://www.faucetscomplete.com/carlon-663168-2-gang-low-voltage-mounting-bracket/, printed Sep. 1, 2021.

Product sheet for Panduit Low Voltage Mounting Bracket—all mount plate—LV-S-1G—Power Strips & Surge Protectors, https://www.cdw.com/product/panduit-low-voltage-mounting-bracket-wall-mount-plate/2782358, printed Sep. 1, 2021.

Product sheet for Low Voltage Stud Mounting Brackets, https://www.orbitelectric.com/low-voltage-stud-mounting-brackets.html, printed Sep. 1, 2021.

Product sheet for Mounting Brackets for Class 2 Low Voltage Wiring, www.arlingtonlowvoltage.com, printed Sep. 1, 2021.

Product sheet for Low Voltage Stud Mounting Brackets, www.orbitelectric.com, printed Sep. 1, 2021.

* cited by examiner

MOUNTING BRACKET

CROSS-REFERENCE TO RELATED APPLICATIONS

This application claims priority under 35 U.S.C. 119 from U.S. Provisional Application No. 63/057,002, filed Jul. 27, 2020, and is incorporated herein by reference in its entirety.

BACKGROUND

In many applications, it may be useful to support electrical devices, including low voltage and power over Ethernet devices. For example, according to some construction standards, electrical devices may be required to be supported at particular heights above a floor or at particular distances from certain other structures or components.

SUMMARY

Some embodiments of the invention provide a mounting bracket for an electrical device and configured for use with a support having an upper rail and a lower rail that is spaced apart from the upper rail. The mounting bracket can include a mounting body configured to secure the electrical device to the mounting bracket between the upper and lower rails when the mounting bracket is secured to the support. The mounting body can include a mounting face to support the electrical device. A first attachment device can be connected to the mounting body, and a second attachment device can be connected to the mounting body opposite the first attachment device. The first attachment device can be configured to selectively engage either of the upper rail or the lower rail to secure the mounting bracket to the support. The second attachment device can be configured to selectively engage either of the other of the upper rail or the lower rail to secure the mounting bracket to the support. Each of the first and second attachment devices can include, respectively, a first arm configured to extend along and engage with a first side of the corresponding upper or lower rail, and a second arm. The second arm can include a bendable tab and can be configured to extend along and engage with a second side of the corresponding upper or lower rail that is opposite the first side.

Some embodiments of the invention provide a mounting bracket for an electrical device and configured for use with a support having an upper rail and a lower rail that is spaced apart from the upper rail. The mounting bracket can include a mounting body that can be configured to secure the electrical device to the mounting bracket between the upper and lower rails when the mounting bracket is secured to the support. The mounting body can include a mounting face to support the electrical device, a first attachment device connected to the mounting body, and a second attachment device connected to the mounting body opposite the first attachment device. The first attachment device can be configured to selectively engage either of the upper rail or the lower rail to secure the mounting bracket to the support. The second attachment device can be configured to selectively engage either of the other of the upper rail or the lower rail to secure the mounting bracket to the support. Each of the first and second attachment devices can include, respectively, a first arm configured to extend along and engage with a first side of the corresponding upper or lower rail and a second arm configured to extend along and engage with a second side of the corresponding upper or lower rail that is opposite the first side.

Some embodiments of the invention provide a method for installing a mounting bracket for a low voltage electrical device on a support having an upper rail and a lower rail that is spaced apart from the upper rail. The method can include engaging a first attachment device of the mounting bracket with the upper rail, wherein the first attachment device includes a first arm configured to extend along and engage with a first side of the upper rail and a second arm configured to extend along and engage with a second side of the upper rail opposite the first side. The method can also include bending a portion of the second arm of the first attachment device to engage a third side of the upper rail. Further, the method can include engaging a second attachment device of the mounting bracket with the lower rail, wherein the second attachment device includes a first arm configured to extend along and engage with a first side of the lower rail and a second arm configured to extend along and engage with a second side of the lower rail opposite the first side.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
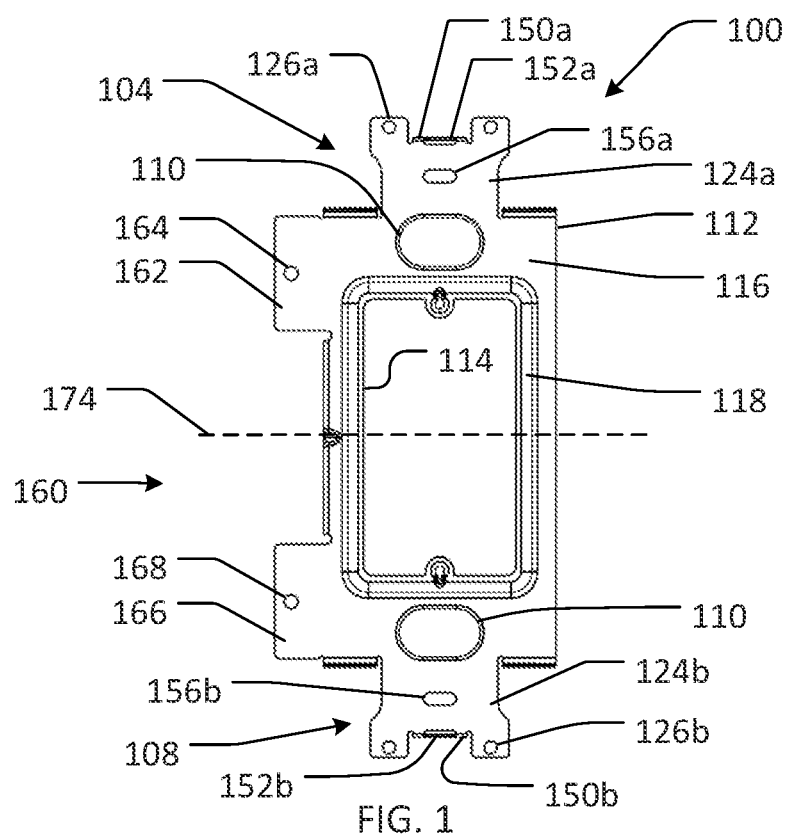
FIG. 1 is a front elevation view of a mounting bracket according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise specified or limited, directional terms are presented only with regard to the particular embodiment and perspective described. For example, reference to features or directions as "horizontal," "vertical," "front," "rear," "left," "right," "upper," "lower," and so on are generally made with reference to a particular figure or example and are not necessarily indicative of an absolute orientation or direction. However, relative directional terms for a particular embodiment may generally apply to alternative orientations of that embodiment. For example, "front" and "rear" directions or features (or "right" and "left" directions or features, and so on) may be generally understood to indicate relatively opposite directions or features for a particular embodiment, regardless of the absolute orientation of the embodiment (or relative orientation relative to environmental structures). "Lateral" and derivatives thereof generally indicate directions that are generally perpendicular to a vertical direction for a relevant reference frame.

Also as used herein, ordinal numbers are used for convenience of presentation only and are generally presented in an order that corresponds to the order in which particular features are introduced in the relevant discussion. Accordingly, for example, a "first" feature may not necessarily have any required structural or sequential relationship to a "second" feature, and so on. Further, similar features may be referred to in different portions of the discussion by different ordinal numbers. For example, a particular feature may be referred to in some discussion as a "first" feature, while a similar or substantially identical feature may be referred to in other discussion as a "third" feature, and so on.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As noted above, in some contexts, it may be useful to support electrical devices and other components relative to structures. Embodiments of the invention can be useful for this purpose, and others. For example, embodiments of the invention can be used to support one or more electrical devices or other electrical components on a support at a configurable distance away from supporting structures, such as wall studs, or in other orientations. As another example, embodiments of the invention can include attachment devices configured to be manually engaged with corresponding rails on a support, for quick, tool-less connection of a mounting bracket to the support. In some embodiments, mounting brackets can include an integral mud ring to which electrical devices can be directly attached.

In some embodiments, an attachment device can include first and second arms configured to extend on opposite sides of a rail. In some such embodiments, the first arm can be configured as a finger that is configured to resiliently engage the rail, and the second arm can be configured as a bendable tab that is configured to engage the rail opposite the finger and, in some cases bent to extend along at least two sides of the rail. In some embodiments, part of an attachment device can be configured for connecting an attachment, such as cable support, conduit support, or any other support attachment.

In some embodiments, an attachment device can include tabs configured to sit flush against adjacent sides of a stud. In some such embodiments, one tab can extend laterally to sit flush on a face of the stud and another tab can extend rearwardly to sit flush along a side of the stud. In some embodiments, attachment devices that are configured to secure a mounting bracket to a rail or other similar feature of a support bracket (e.g., a telescoping between-stud bracket) can also be configured to secure the mounting bracket to a stud. For example, an attachment device may include features to engage a rail of a between-stud bracket when in a first orientation and to engage a stud when in a second orientation.

Embodiments of the invention are presented below in the context of mounting brackets for electrical devices. Generally, the principles disclosed herein can be used with any variety of mounting brackets, including stud-mounted brackets, floor-supported brackets, between-stud brackets, and so on, and can be used to secure any variety of components in place.

With regard to construction, each of the embodiments presented below can be readily formed as an integral stamping, with mechanical or other (e.g., welded, adhesive-based, etc.) attachment of other components, as needed. In other embodiments, however, other manufacturing techniques can be used, including deep drawing, extrusion, additive manufacturing, casting, and so on.

Figure 3:
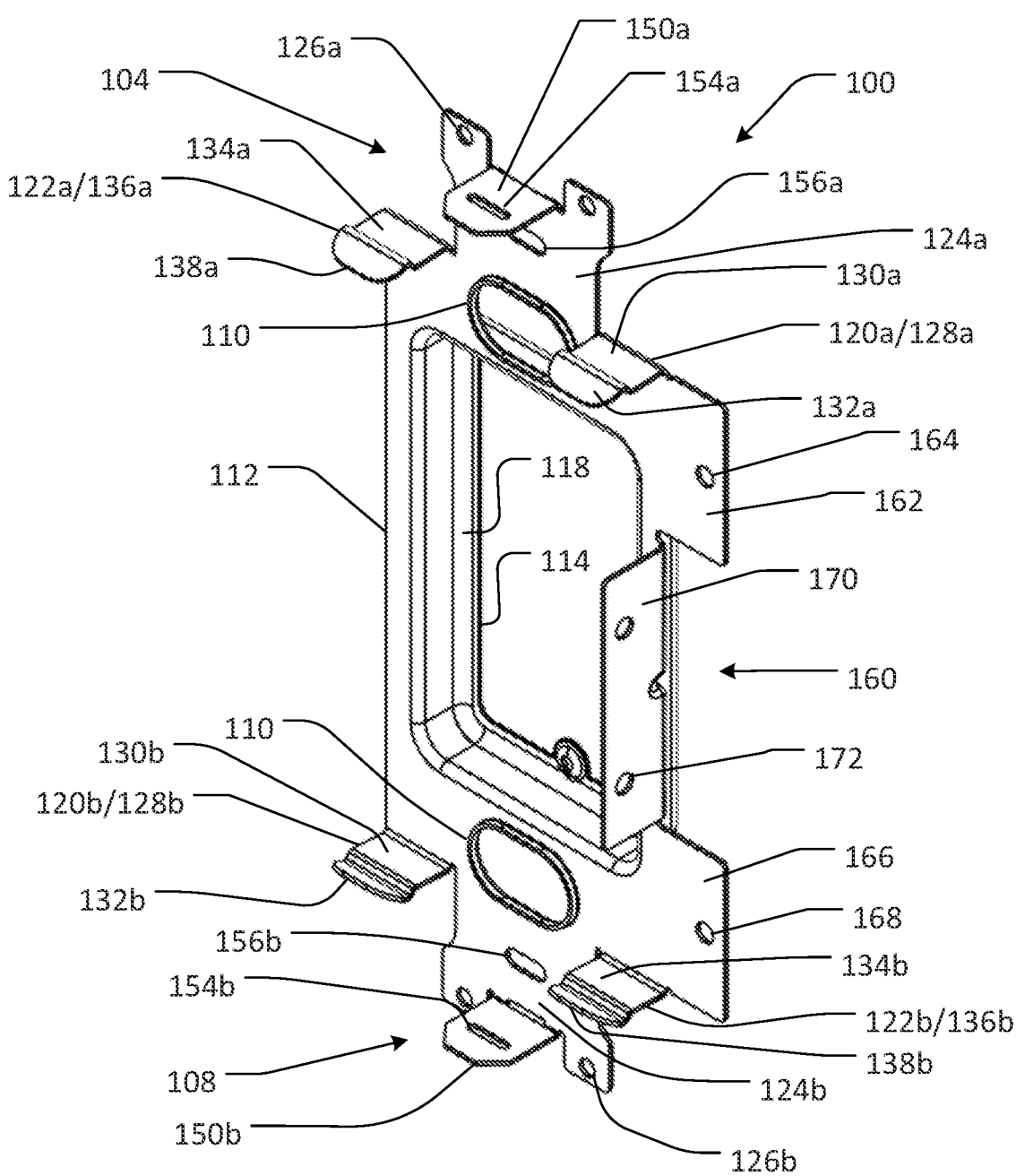
FIG. 3 is a rear isometric view of the mounting bracket of FIG. 1.
Figure 4A:
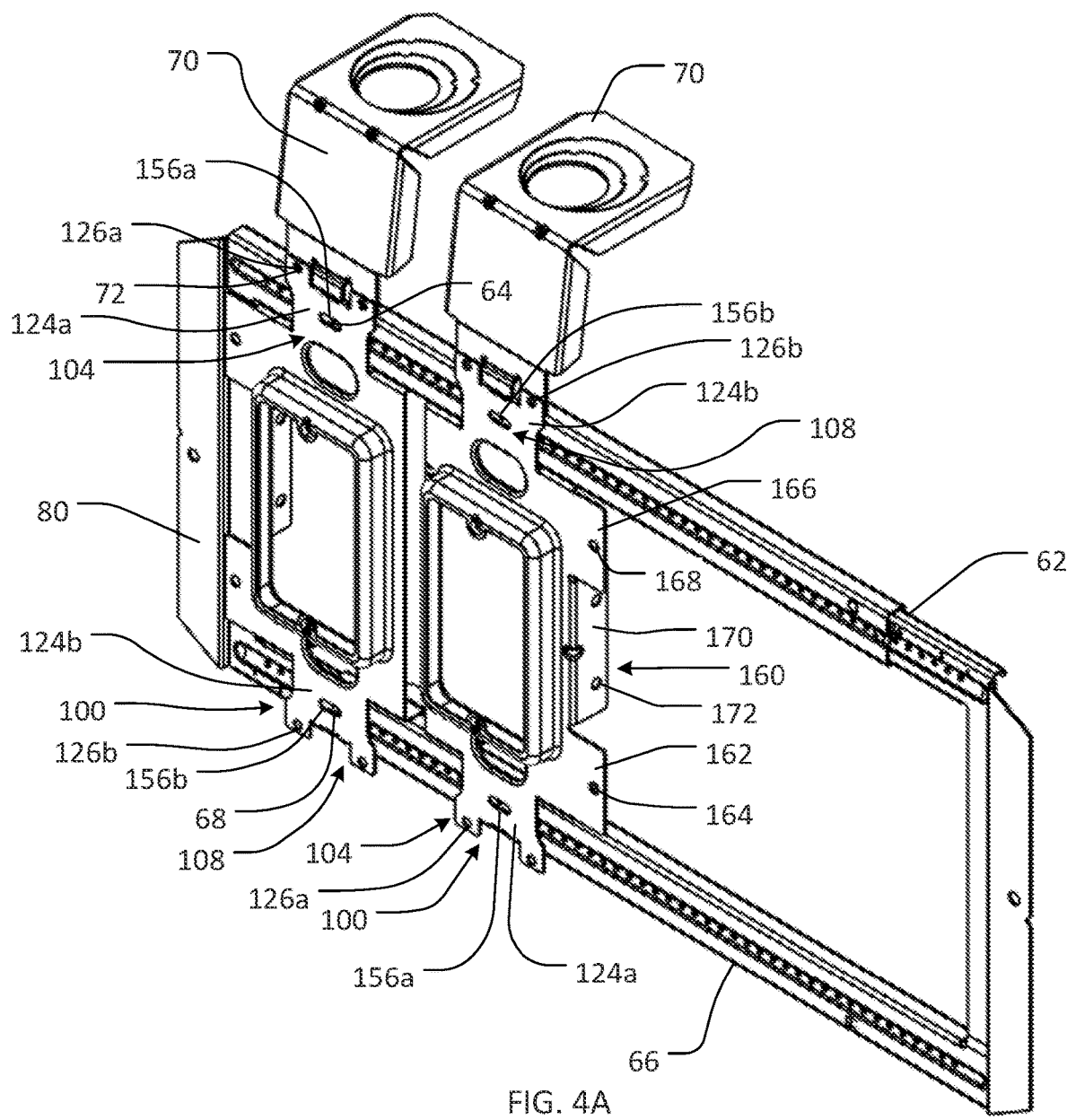
FIG. 4A is a front isometric view of the mounting bracket of FIG. 1 with a support and a support attachment.
Figure 4B:
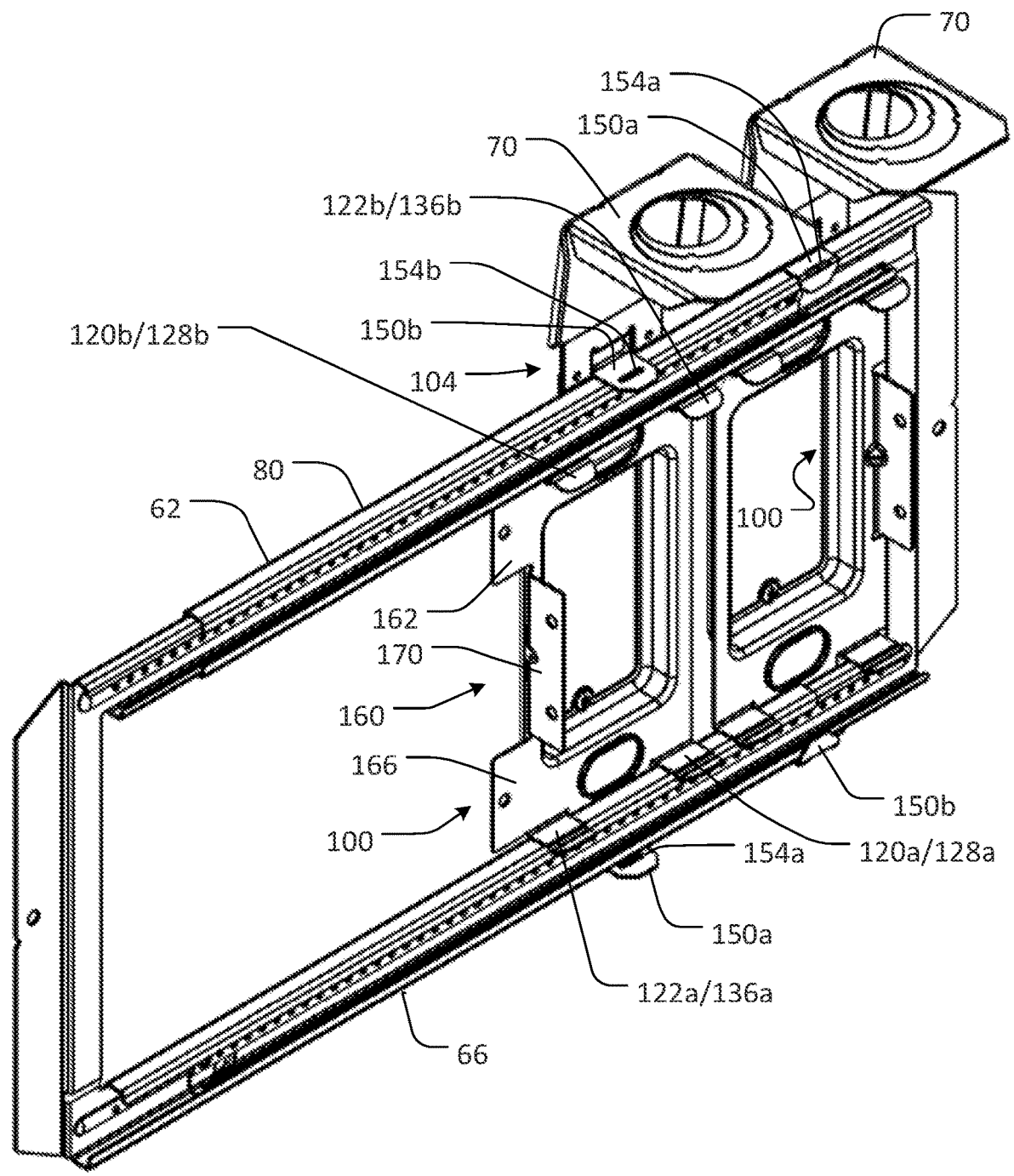
FIG. 4B is a rear isometric view of the mounting bracket of FIG. 1 with a support and a support attachment.
Figure 5:
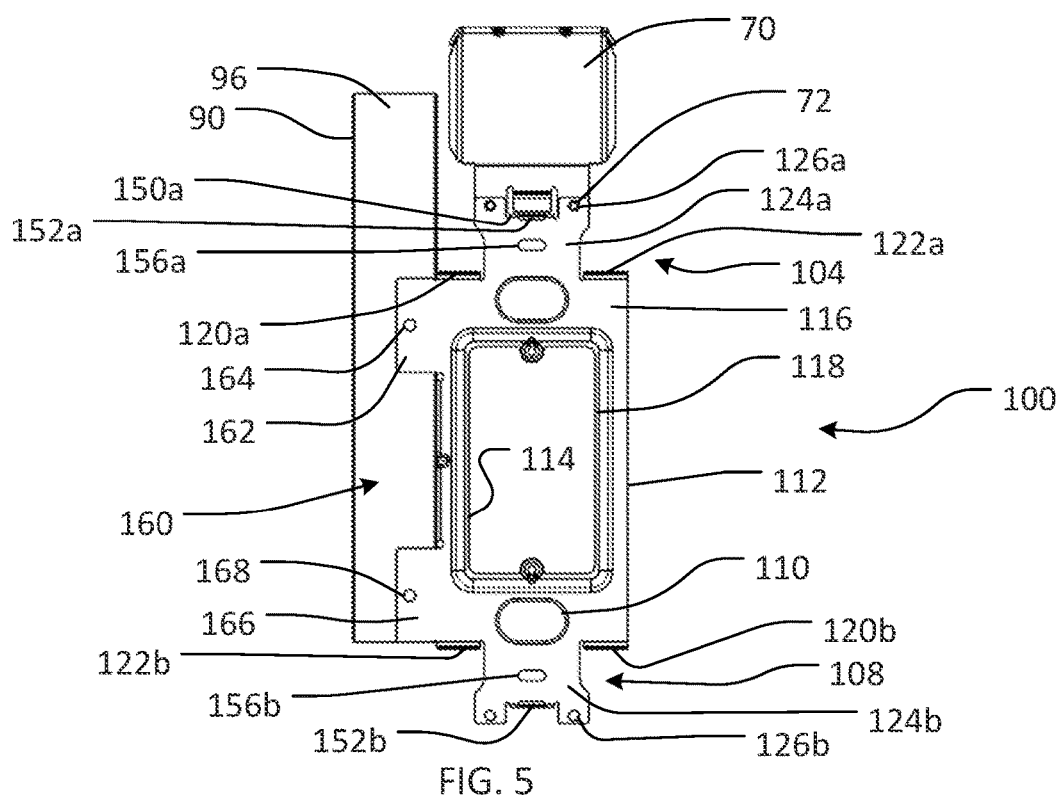
FIG. 5 is a front elevation view of the mounting bracket of FIG. 1 in a first orientation with a stud and a support attachment.
Figure 6:
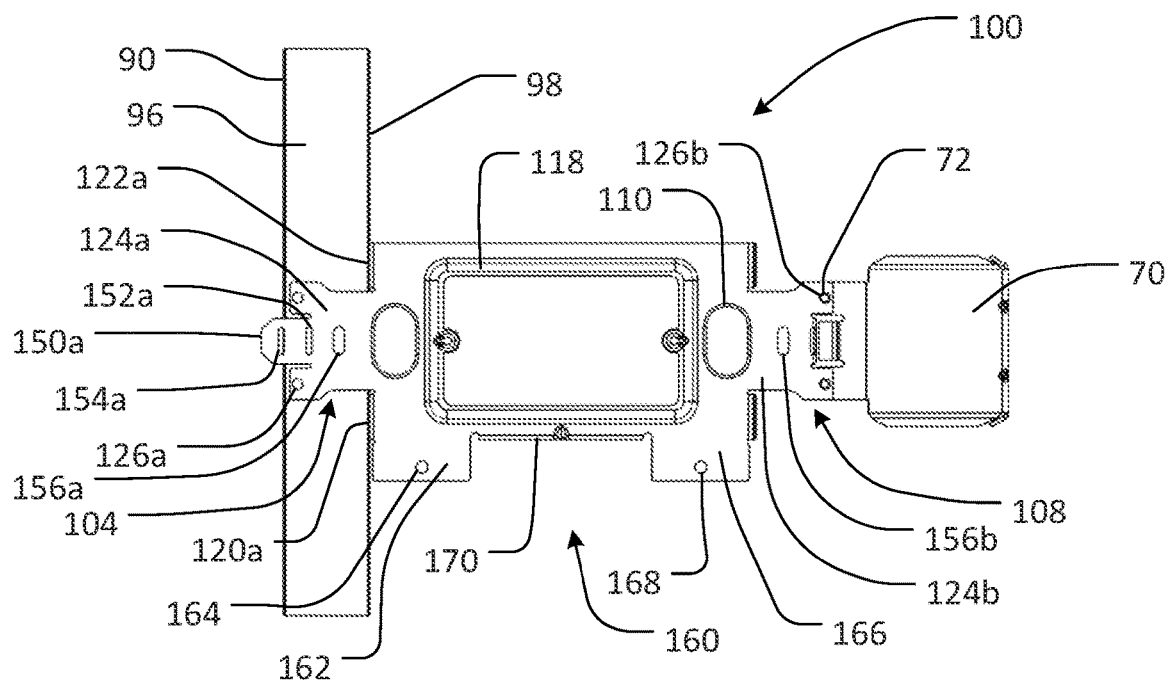
FIG. 6 is a front elevation view of the mounting bracket of FIG. 1 in a second orientation with a stud and a support attachment.
Figure 7:
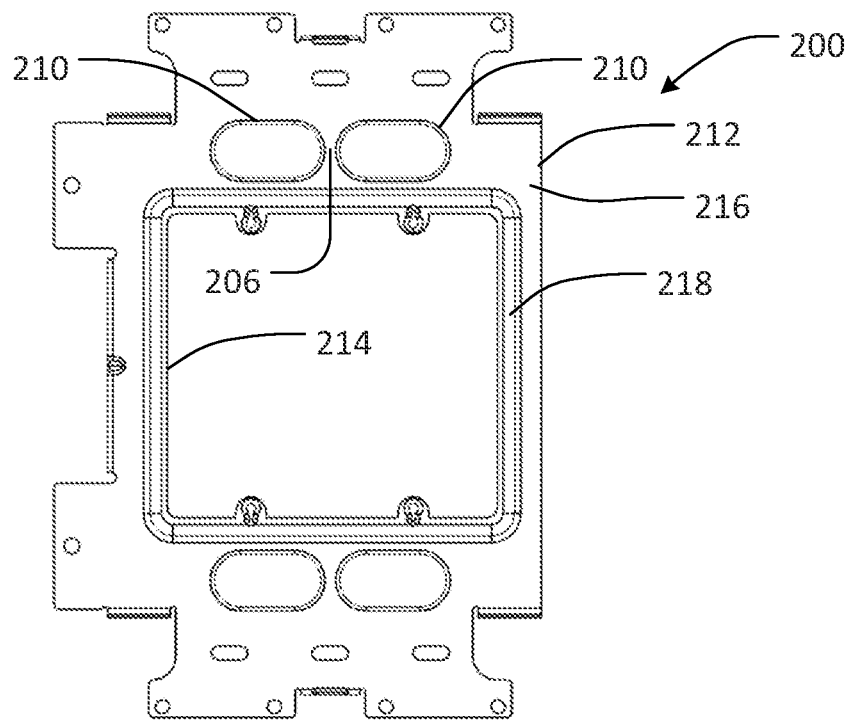
FIG. 7 is a front elevation view of another mounting bracket according to an embodiment of the invention.
Figure 8:
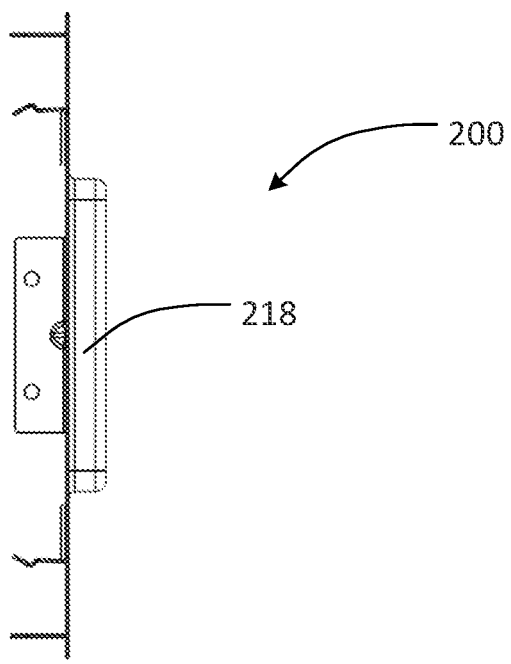
FIG. 8 is a side elevation view of the mounting bracket FIG. 7.
Figure 9:
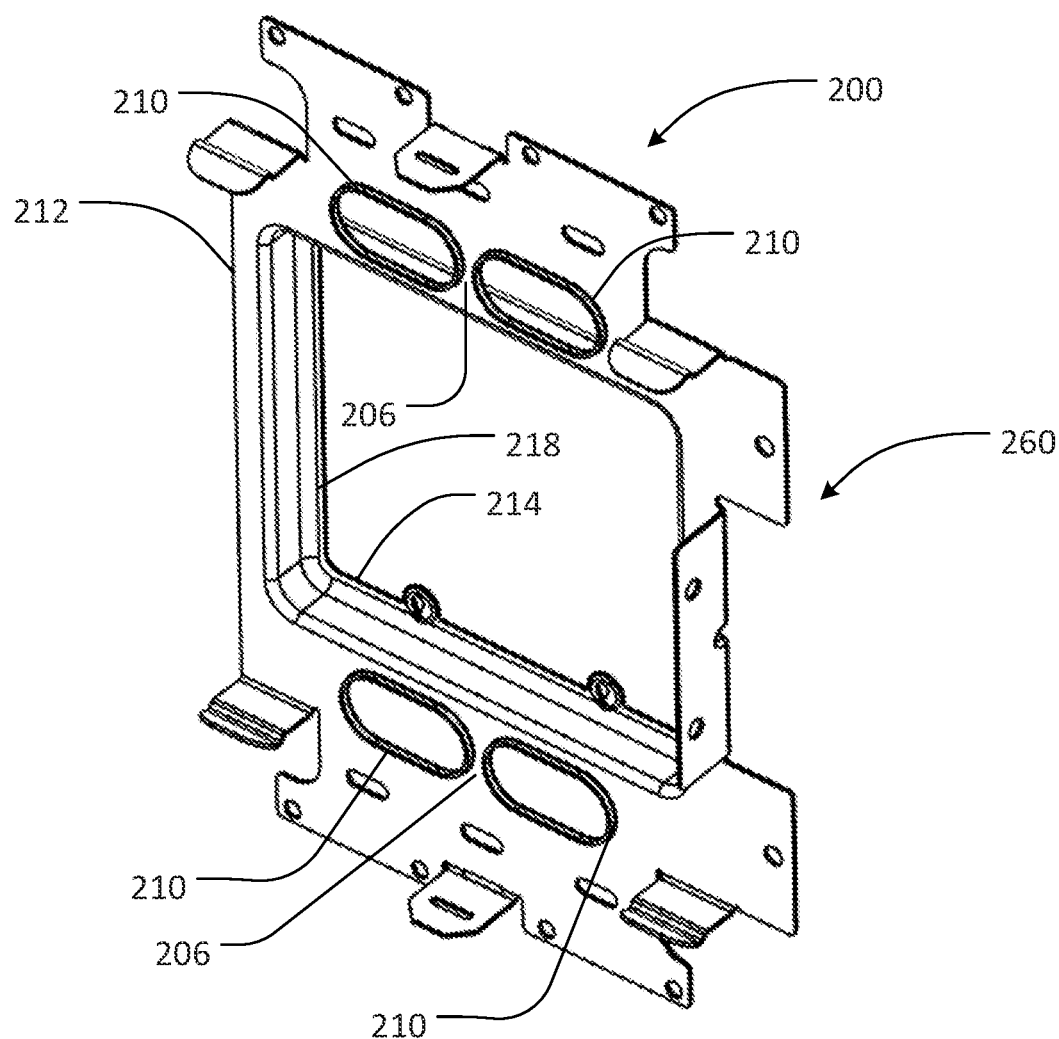
FIG. 9 is a rear isometric view of the mounting bracket of FIG. 7.
Figure 10:
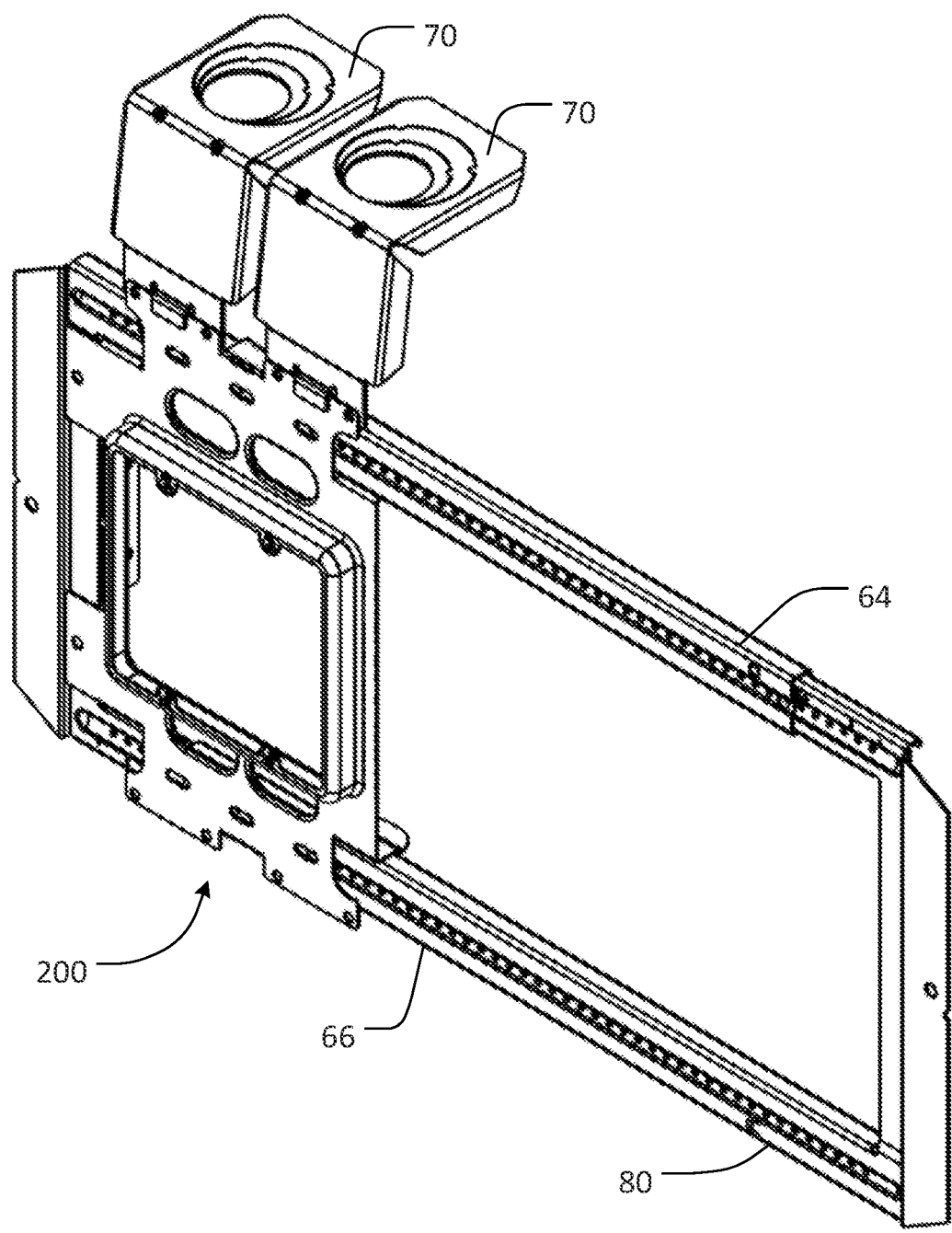
FIG. 10 is a front isometric view of the mounting bracket of FIG. 7 with a support and support attachments.
Figure 11:
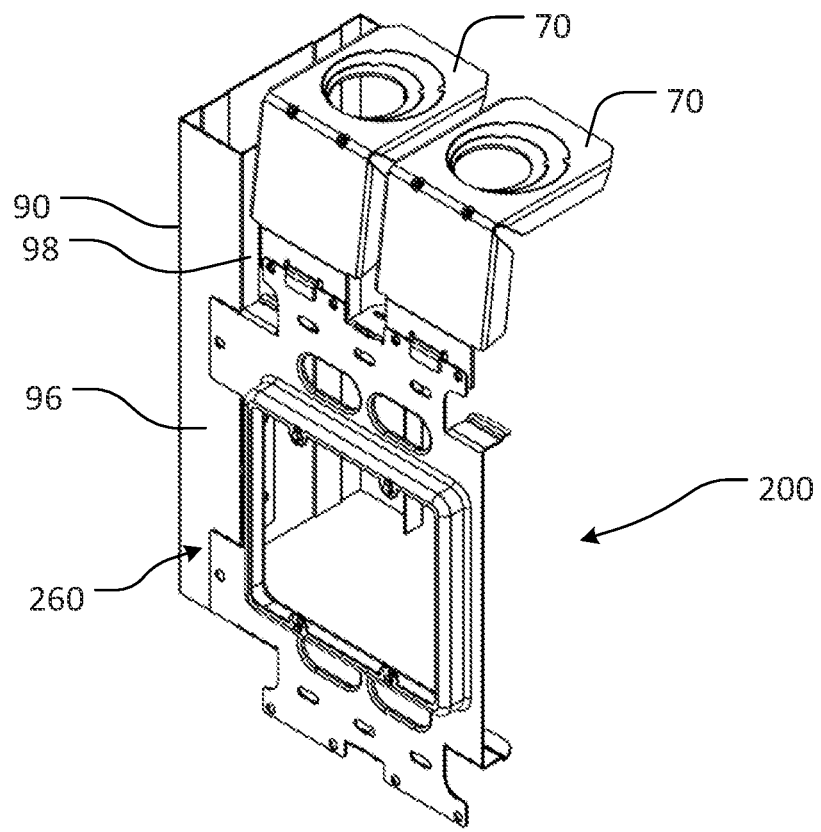
FIG. 11 is a front isometric view of the mounting bracket of FIG. 7 in a first orientation with a stud and support attachments.

FIGS. 1-6 illustrate an embodiment of a mounting bracket 100 configured for mounting an electrical device (not shown) on a support 80 (shown in FIGS. 4A and 4B) that includes a first (e.g., upper) rail 62 and a second (e.g., lower) rail 66 or a stud 90 (shown in FIGS. 5 and 6). As illustrated, the mounting bracket 100 is formed as a stamping from a single blank of material (e.g., 23 gauge pre-galvanized mild steel), although a variety of other approaches are possible.

In the illustrated embodiment, the mounting bracket 100 includes a mounting body 112 a first attachment device 104 and a second attachment device 108 connected to opposite sides of a mounting body 112, a third attachment device 160 connected on a side of the mounting body 112 adjacent the first and second attachment devices 104, 108 (and the sides of the mounting body 112 that includes the attachment devices 104, 108). Each of the first and second attachment devices 104, 108 is configured to engage one of the first and second rails 62, 66 to secure the mounting bracket 100 to the support 80, similar to the mounting bracket described in U.S. application Ser. No. 16/890,431, which is incorporated herein by reference. Each of the first, second, and third attachment devices 104, 108, 160 is configured for attachment to the stud 90.

The mounting body 112, which is configured to be seated against a first side of the support 80, has a central opening 114 and a mounting face 116. In the embodiment illustrated, a mud ring 118 protrudes from the mounting face 116 and around the central opening 114. The mud ring 118 is integrally formed with the mounting body 112, but other embodiments could include a separately mounted or secured mud ring. The integral mud ring 118 allows an installer to install one unitary component to the support 80 or the stud 90 for low-voltage applications. Apertures 110 are also provided extending through the mounting body 112 on either side of the central opening 114 adjacent the first and second attachment devices 104, 108. The apertures 110 allow an installer to see to through the mounting bracket 100, for example, to view low-voltage conductors (not shown).

Figure 2:
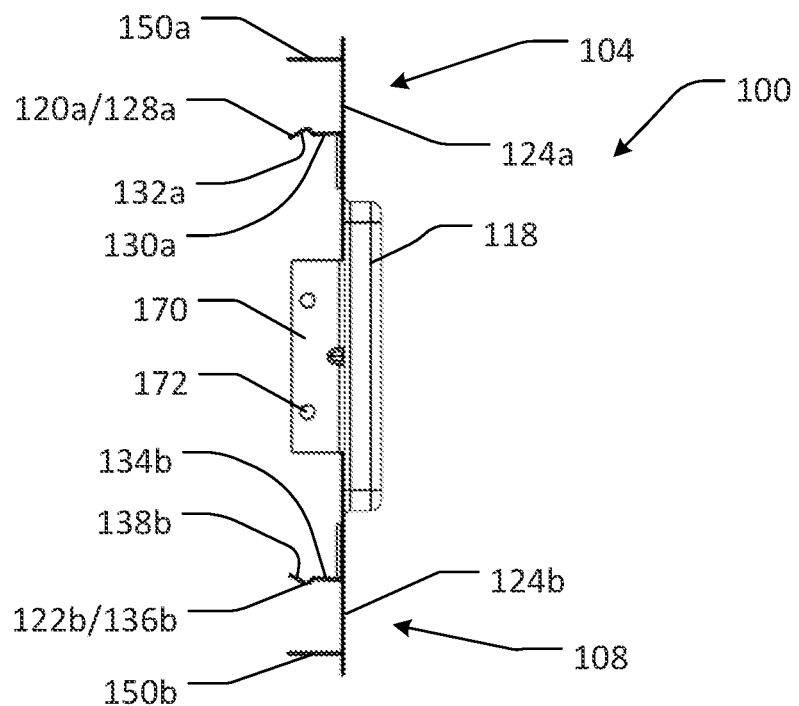
FIG. 2 is a side elevation view of the mounting bracket FIG. 1.

As illustrated in FIGS. 2 and 3, each of the first attachment device 104 and the second attachment device 108 includes: a first arm 120a, 120b; a second arm 122a, 122b opposite the first arm 120a, 120b; a third arm 150a, 150b between the first arm 120a, 120b and the second arm 122a, 122b; and a connecting wall 124a, 124b extending between the first arm 120a, 120b and the second arm 122a, 122b. Each of the connecting walls 124a, 124b extends horizontally (in the illustrated orientation) between the first arm 120a, 120b and the second arm 122a, 122b and vertically (in the illustrated orientation) away from the mounting body 112. The connecting walls 124a, 124b are integrally formed with the mounting body 112 but can otherwise be attached thereto. The first arm 120a, 120b is generally laterally spaced apart from the second arm 122a, 122b. The first arm 120a, 120b and the second arm 122a, 122b also extend generally perpendicularly away from the mounting body 112. The third arm 150a, 150b extends from the connecting wall 124a, 124b and is vertically spaced from and positioned laterally between the first arm 120a, 120b and the second arm 122a, 122b. This multi-arm, laterally and vertically spaced arrangement can allow for the mounting bracket 100 to be reliably secured to a support, including at opposing rails of telescoping brackets, although differently configured arms are possible in other embodiments.

In some embodiments, including the one shown, the third arm 150a, 150b is a bendable tab. In an unbent configuration, as shown in FIG. 6, the third arm 150a, 150b extends co-planarly with the connecting wall 124a, 124b from the mounting body 120. As needed, the third arm 150a, 150b can be selectively bent at bending features 152a, 152b, 154a, 154*b* (e.g., a slot, cut, or score line) between the unbent configuration (see FIG. 6) and a bent configuration (FIGS. 2 and 3).

The third arm 150*a*, 150*b* can be provided to further secure the mounting bracket 100 to the support 80. For example, looking at FIGS. 4A and 4B, the first arm 120*a*, 120*b* and the second arm 122*a*, 122*b* may be configured to resiliently engage top and bottom sides of each of the first and second rails 62, 66 of the support 80 to stage the mounting bracket 100 on the support 80, and the third arm 150*a*, 150*b* can then be bent at bending feature 152*a*, 152*b* to extend over the other of the top and bottom sides of each of the first and second rails 62, 66. The third arm 150*a*, 150*b* can then be bent at bending feature 154*a*, 154*b*, into a further bent configuration, to engage a back side of one or both of the first and second rails 62, 66 to help prevent the mounting bracket 100 from being pulled off of the support 80. A fastener (not shown) can be received through a slot 156*a* in the connecting wall 124*a* (see also FIG. 1) to secure the mounting bracket 100, for example, within a hole 64 in the first rail 62 of the support 80. Additionally, or alternatively, a fastener (not shown) can be received through a slot 156*b* in the connecting wall 124*b* (see also FIG. 1) to secure the mounting bracket 100, for example, within a hole 68 in the second rail 66 of the support 80. As shown, the mounting bracket 100 can be oriented with the first attachment device 104 on top and the second attachment device 108 on bottom, or with the second attachment device 108 on top and the first attachment device 104 on bottom.

In different embodiments, arms of attachment devices can be configured in a variety of ways, including to provide secure engagement on opposing sides of a relevant rail of a support. In the illustrated embodiment, each of the first arms 120*a*, 120*b* is configured as a resiliently deformable spring arm that includes a finger 128*a*, 128*b* that is configured to extend past the corresponding first or second rail 62, 66 and engage a back side thereof, opposite the front side of the support 80. In particular, each of the fingers 128*a*, 128*b* includes a horizontal segment 130*a*, 130*b* that extends perpendicularly from the mounting body 112 to an angled engagement feature 132*a*, 132*b*. The angled engagement features 132*a*, 132*b* protrude obliquely from the segments 130*a*, 130*b* (e.g., partially vertically), in opposite relative directions, towards the corresponding second arm 122*a*, 122*b*. The illustrated angled engagement features 132*a*, 132*b* include two linear segments that are generally oriented in a V-shape, such as may allow for easy snap-on engagement with rails of a support, although other configurations are possible. Some embodiments can include angled segments that have more than two segments or only one segment. Additionally or alternatively, at least one segment of an angled engagement feature may be curved rather than linear. For example, some embodiments can include an angled engagement feature that is configured as a smooth curve. Similarly, each of the second arms 122*a*, 122*b* include a finger 136*a*, 136*b* with a horizontal segment 134*a*, 134*b* and an angled engagement feature 138*a*, 138*b*.

In some embodiments, the connecting wall 124*a*, 124*b* may form part of the first and second attachment devices 104, 108 to assist in attaching the mounting bracket 100 to a support feature, including supports for conductors that may extend away from an electrical device secured to the mounting bracket 100. As shown in FIGS. 4A-6, for example, connecting wall 124*a*, 124*b* extends past the third arm 150*a*, 150*b* and has holes 126*a*, 126*b*. A support attachment 70 has complementary holes 72 that, when aligned with the holes 126*a*, 126*b* of the connecting wall 124*a*, 124*b* of the first and second attachment devices 104, 108, can receive a fastener (not shown) to secure the support attachment 70 to the mounting bracket 100. The support attachment 70, as shown, can be configured to support a conduit (not shown) or a cable (not shown), although other attachments that can be engaged with the mounting bracket 100 may be differently configured. The support attachment 70 is shown attached to the first attachment device 104 as described above; however, the support attachment 70 can also be attached to the second attachment device 108 or support attachments can be attached to both the first and second attachment devices 104, 108.

Looking at FIG. 3, in particular, the third attachment device 160 is shown. The third attachment device 160 has a first tab 162 extending laterally from the mounting body 112 adjacent the first attachment device 104, a second tab 166 extending laterally from the mounting body 112 adjacent the second attachment device 108 in the same direction as the first tab 162, and a third tab 170 between the first and second tabs 162, 166 and extending rearwardly from the mounting body 112 away from the mounting face 116. The first tab 162 has a hole 164 to receive a fastener (not shown). Similarly, the second tab 166 has a hole 168 to receive a fastener (not shown). The third tab 170 also has at least one hole, shown here as a set of holes 172, to receive one or more fasteners (not shown).

In some embodiments, different attachment devices can be configured to secure a mounting bracket to different types of structures (e.g., studs and between-stud brackets) in a variety of different orientations. For example, in FIGS. 5 and 6, the mounting bracket 100 is shown attached to the stud 90 in two orientations rotated 90 degrees from each other. In FIG. 5, the mounting bracket 100 is attached to the stud 90 with the third attachment device 160. The first and second tabs 162, 166 sit flush against a face 96 of the stud 90 and the third tab 170 sits flush against a side 98 of the stud 90. Fasteners (not shown) can then be received through the holes 164, 168 of the first and second tabs 162, 166, respectively, into the face 96 of the stud 90 and, as needed, fasteners (not shown) can be received through the set of holes 172 in the third tab 170 into the side 98 of the stud 90.

Figure 12:
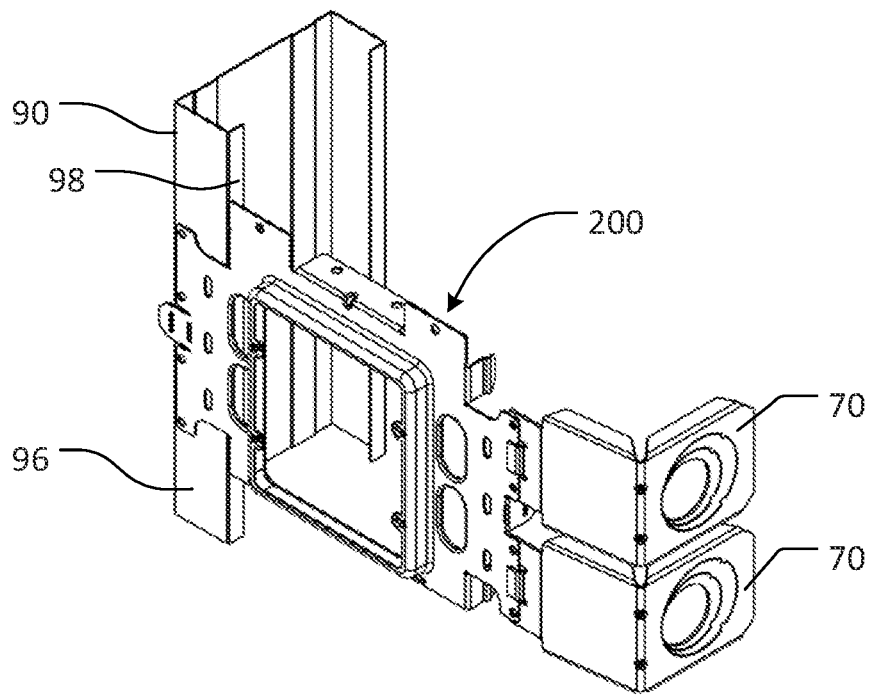
FIG. 12 is a front isometric view of the mounting bracket of FIG. 7 in a second orientation with a stud and support attachments.
Figure 13:
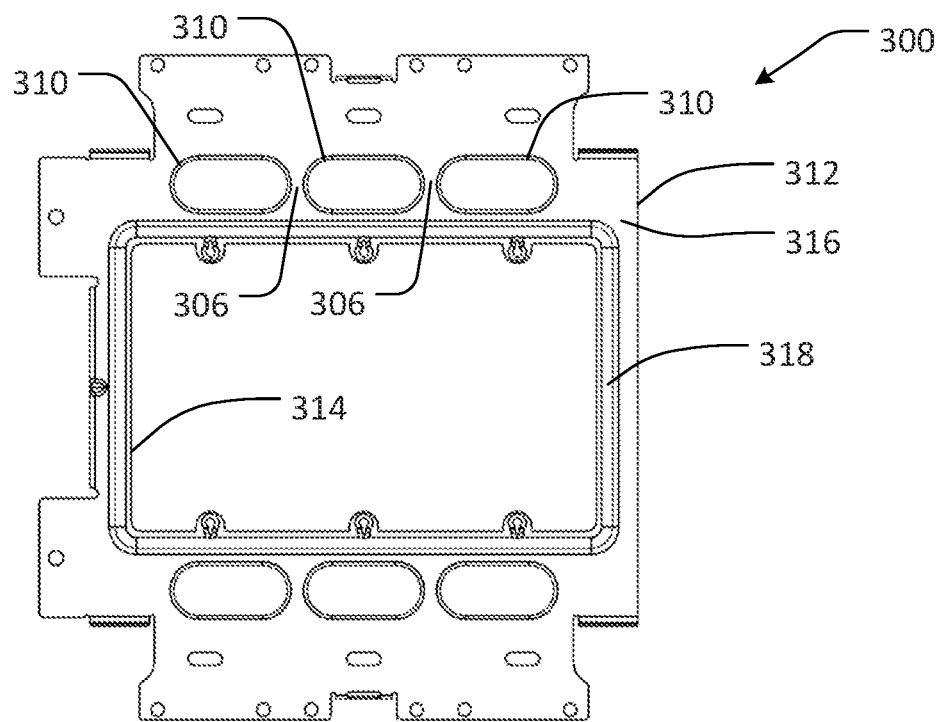
FIG. 13 is a front elevation view of another mounting bracket according to an embodiment of the invention.
Figure 14:
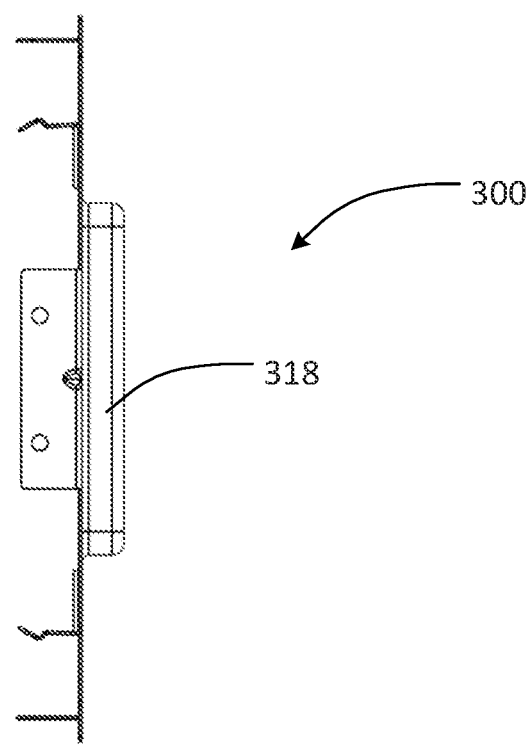
FIG. 14 is a side elevation view of the mounting bracket FIG. 13.
Figure 15:
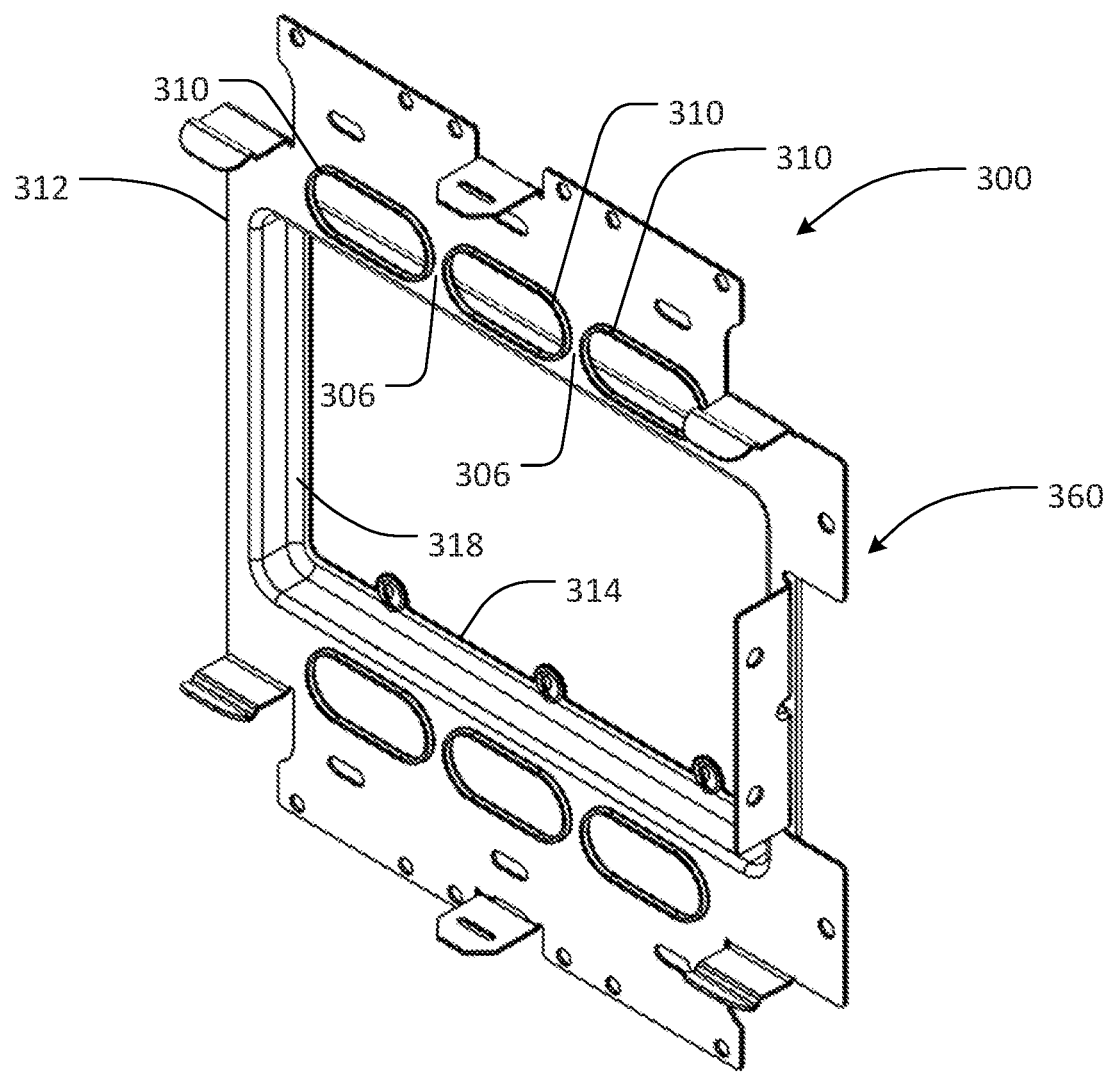
FIG. 15 is a rear isometric view of the mounting bracket of FIG. 13.
Figure 16:
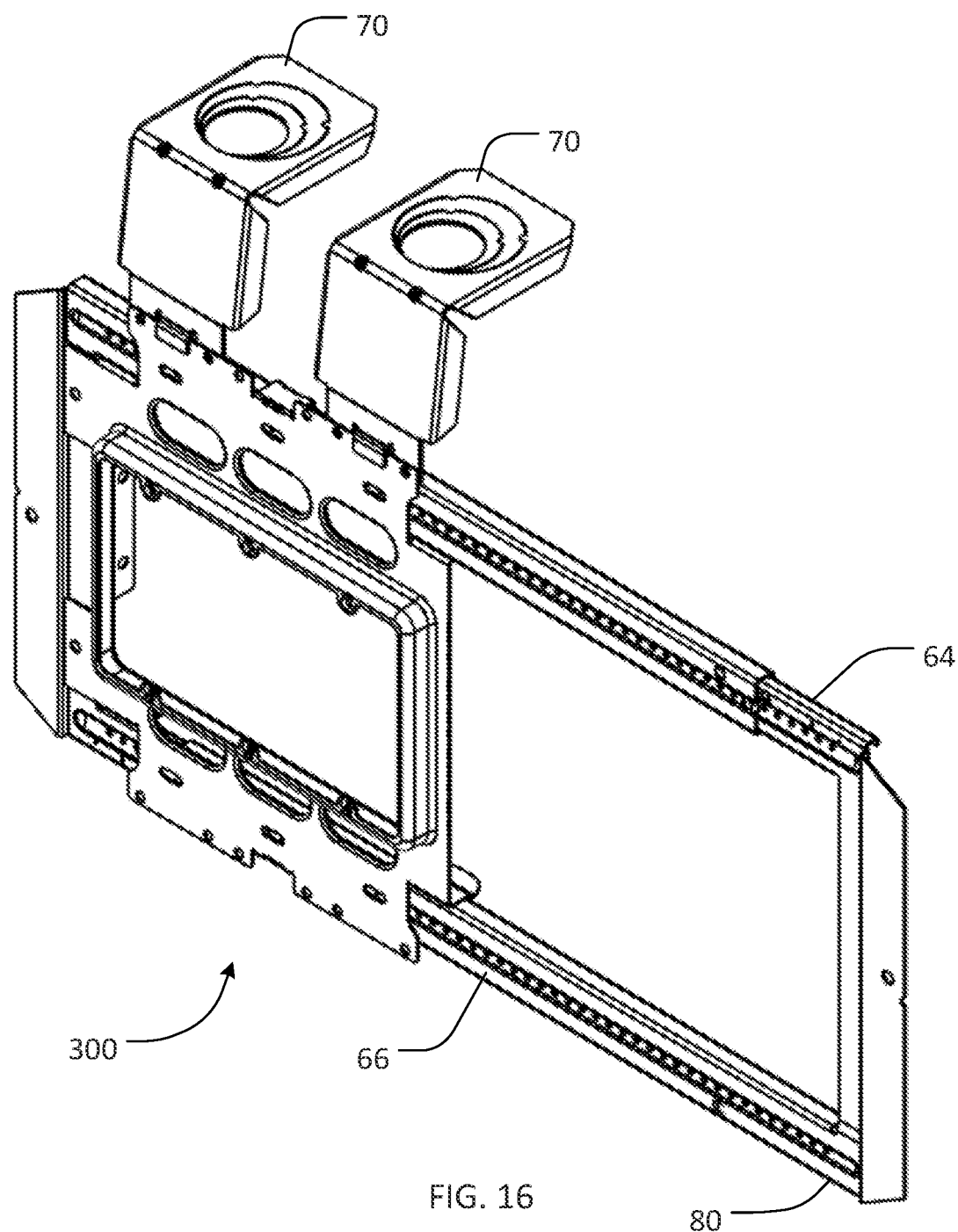
FIG. 16 is a front isometric view of the mounting bracket of FIG. 13 with a support and support attachments.
Figure 17:
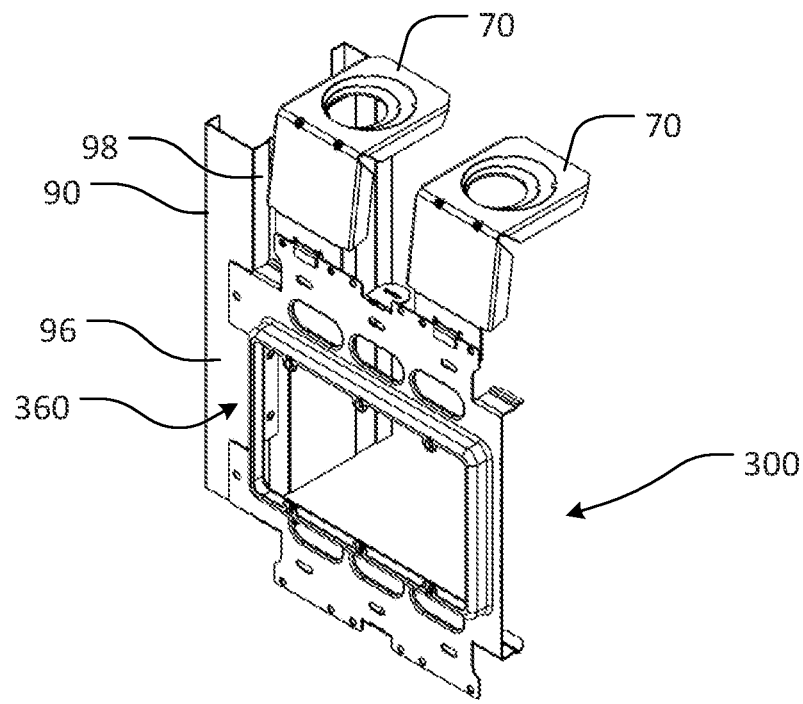
FIG. 17 is a front isometric view of the mounting bracket of FIG. 13 in a first orientation with a stud and support attachments.
Figure 18:
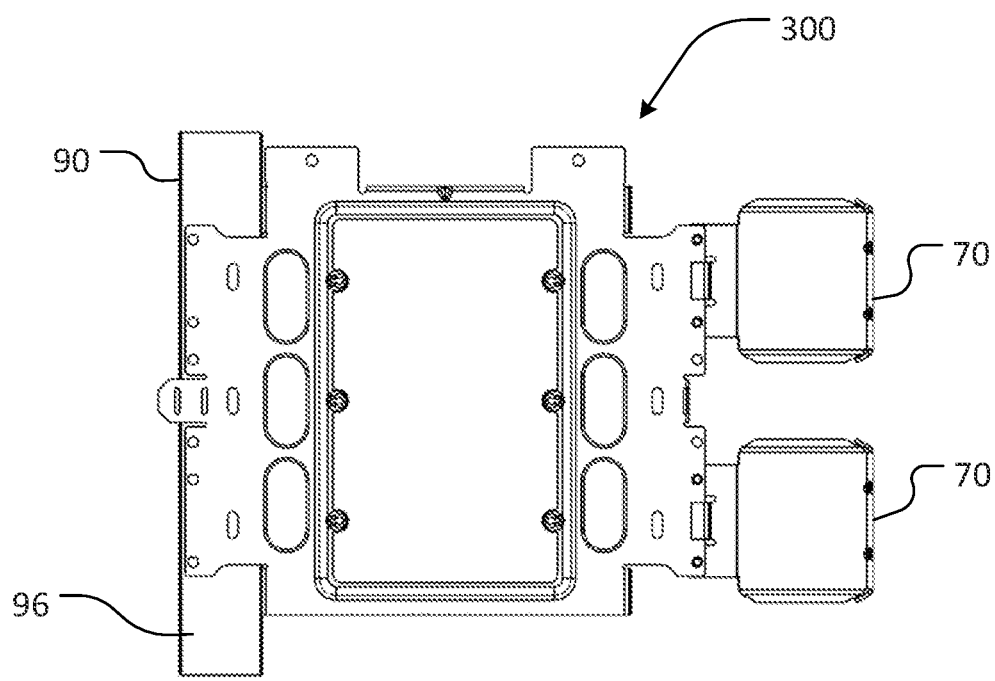
FIG. 18 is a front elevation view of the mounting bracket of FIG. 13 in a second orientation with a stud and support attachments.
Figure 19:
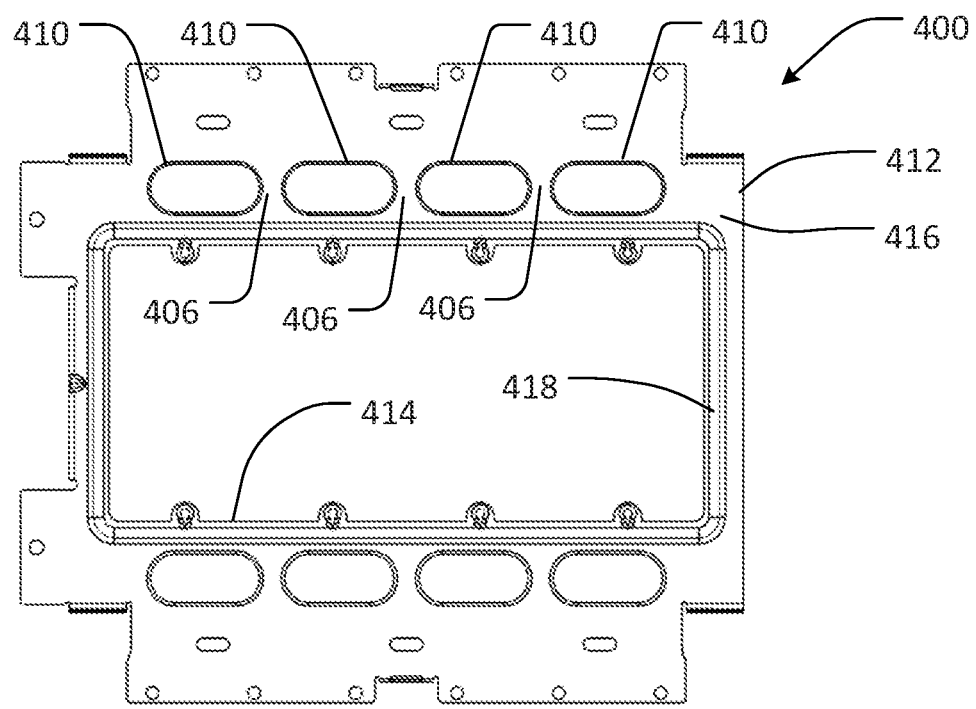
FIG. 19 is a front elevation view of another mounting bracket according to an embodiment of the invention.
Figure 20:
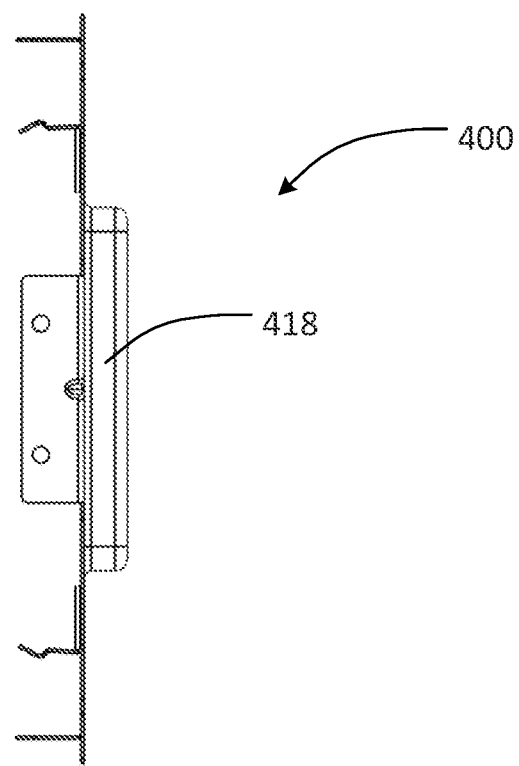
FIG. 20 is a side elevation view of the mounting bracket FIG. 19.
Figure 21:
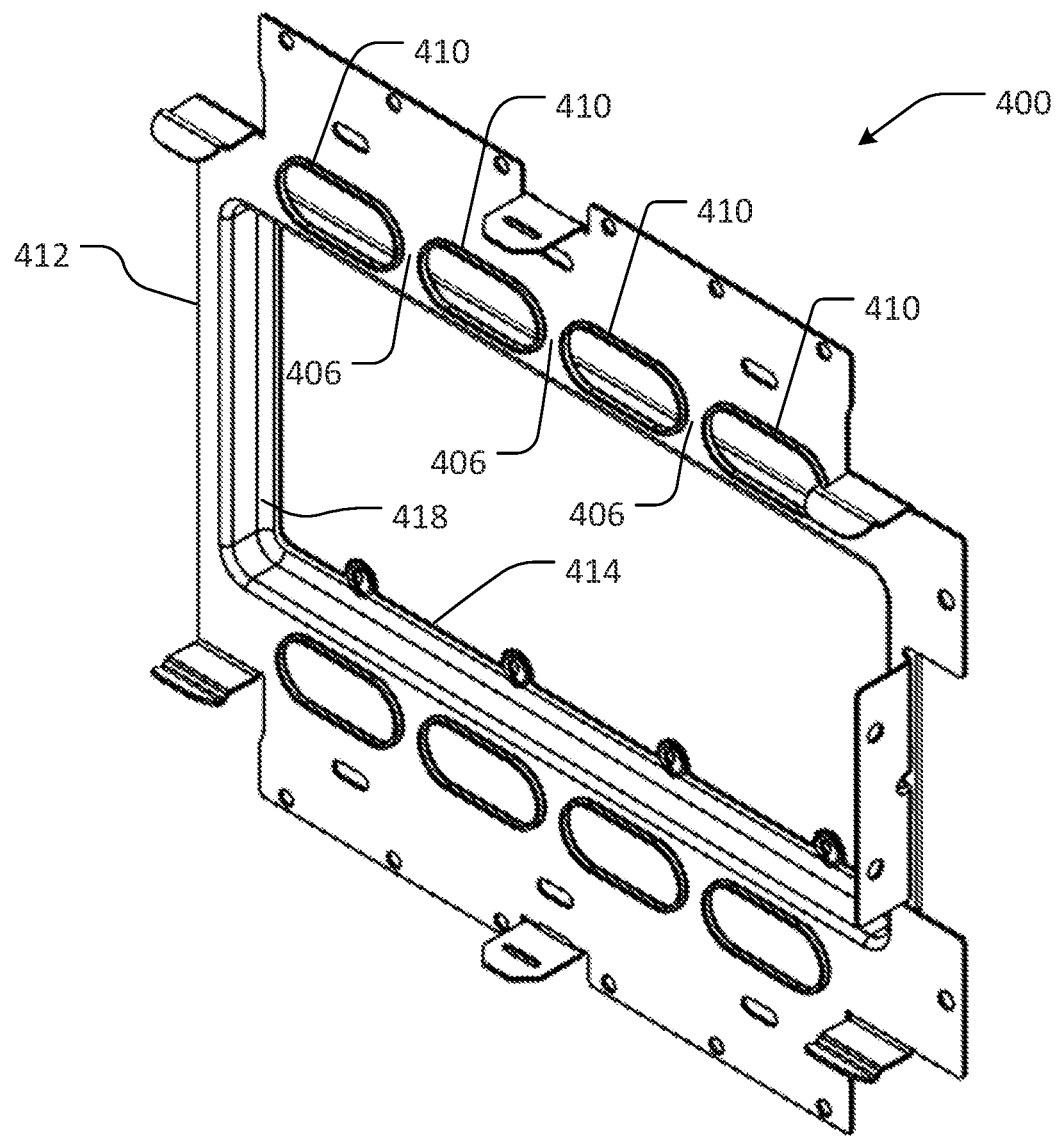
FIG. 21 is a rear isometric view of the mounting bracket of FIG. 19.
Figure 22:
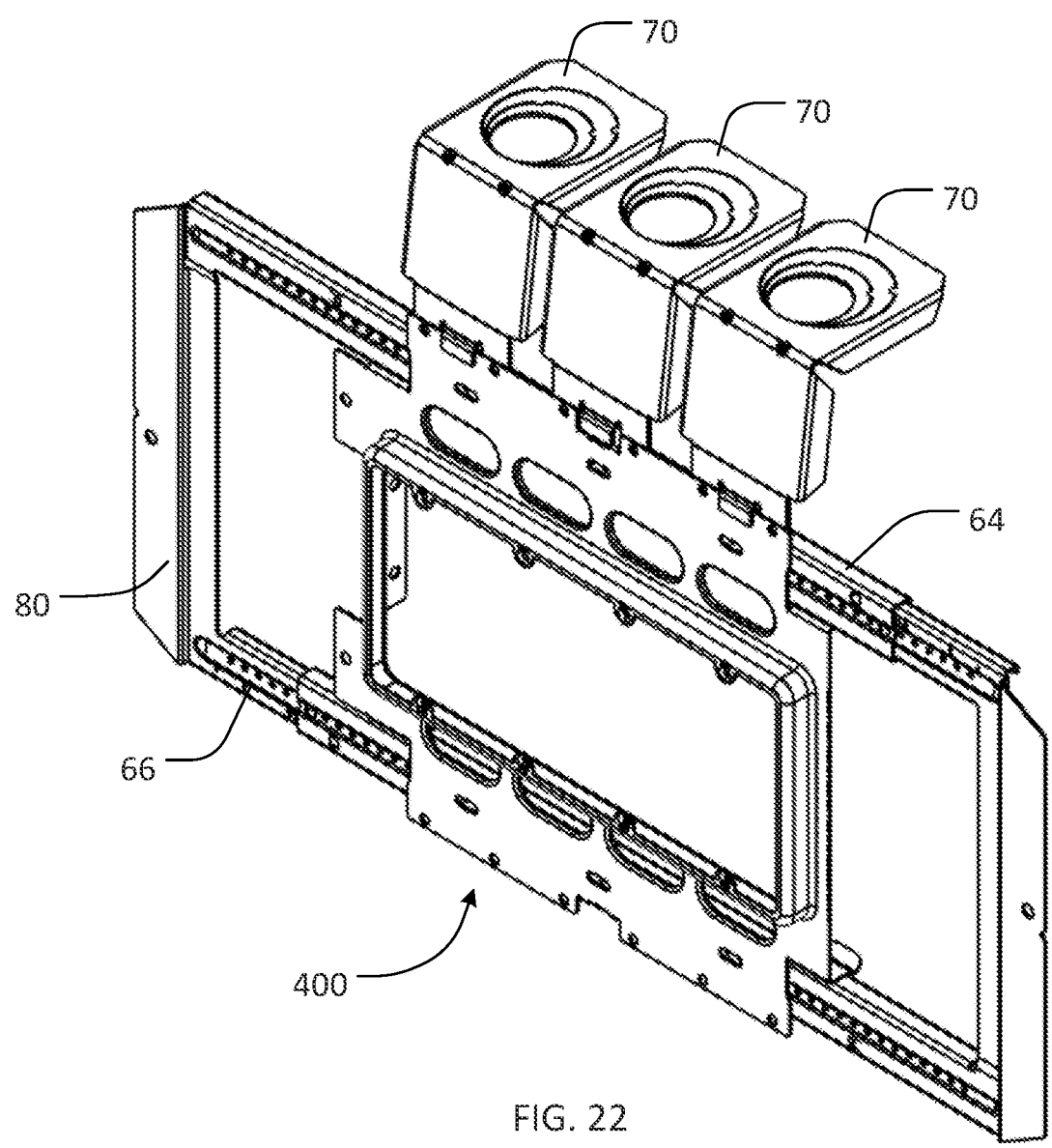
FIG. 22 is a front isometric view of the mounting bracket of FIG. 19 with a support and support attachments.
Figure 23:
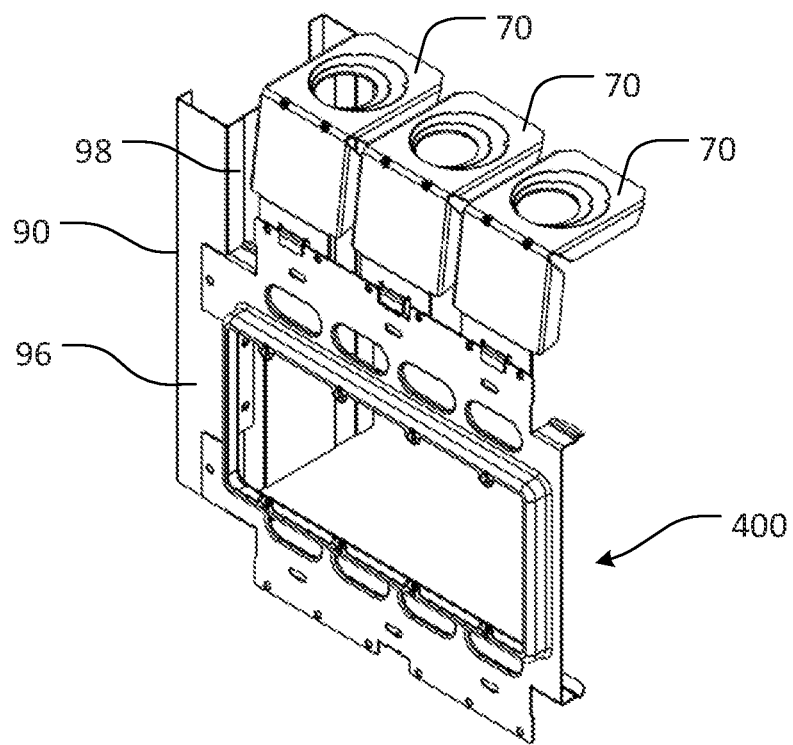
FIG. 23 is a front isometric view of the mounting bracket of FIG. 19 in a first orientation with a stud and support attachments.
Figure 24:
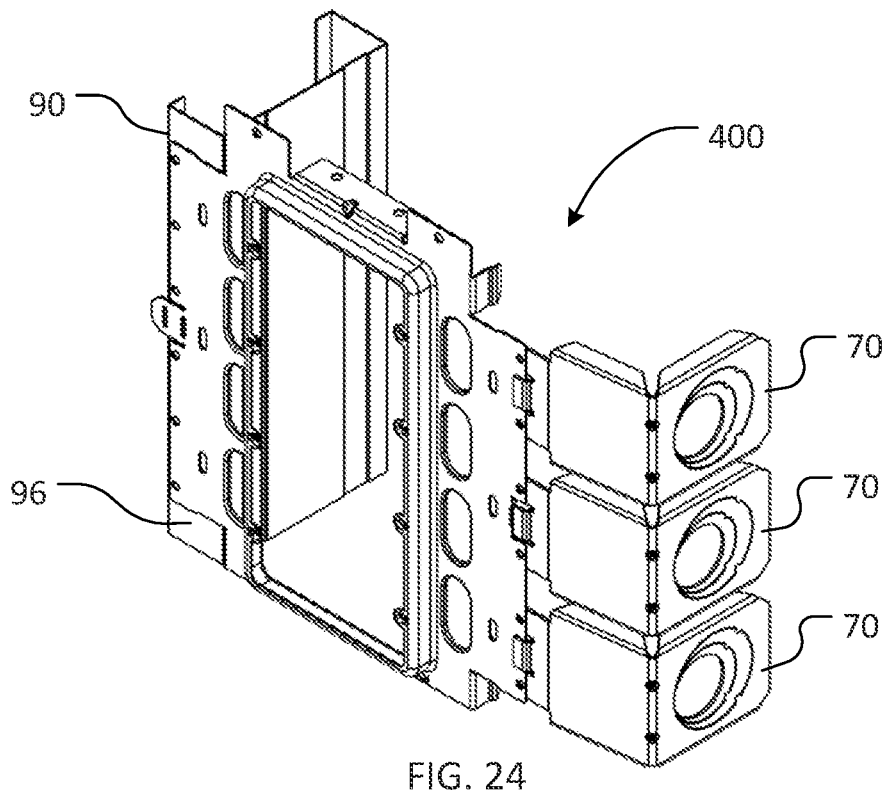
FIG. 24 is a front isometric view of the mounting bracket of FIG. 19 in a second orientation with a stud and support attachments.
Figure 25:
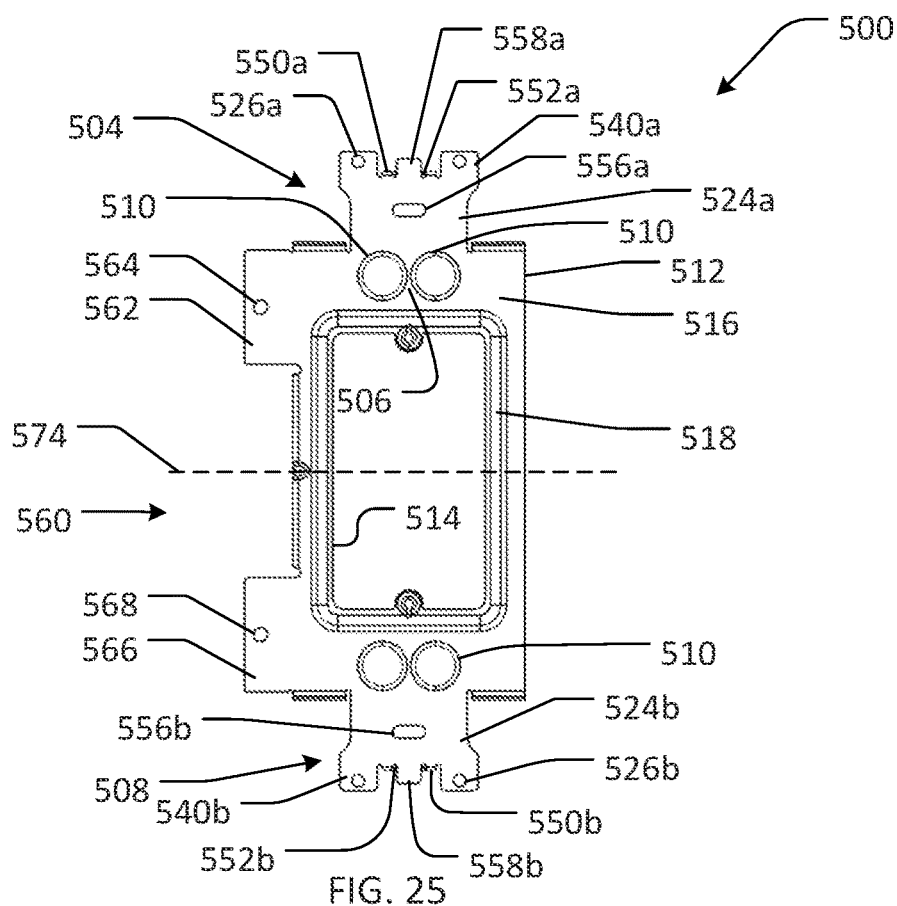
FIG. 25 is a front elevation view of another mounting bracket according to an embodiment of the invention.
Figure 26:
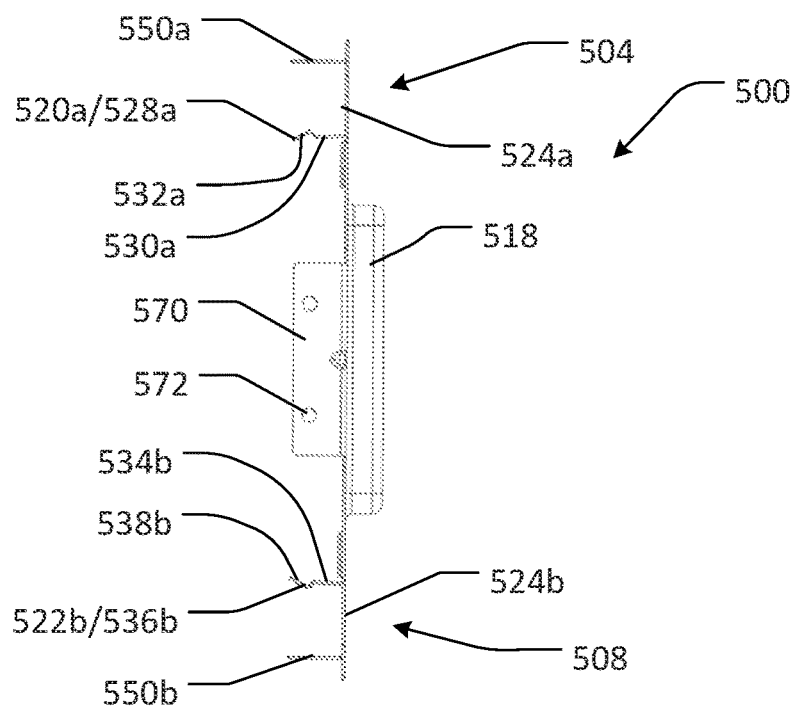
FIG. 26 is a side elevation view of the mounting bracket FIG. 25.
Figure 27:
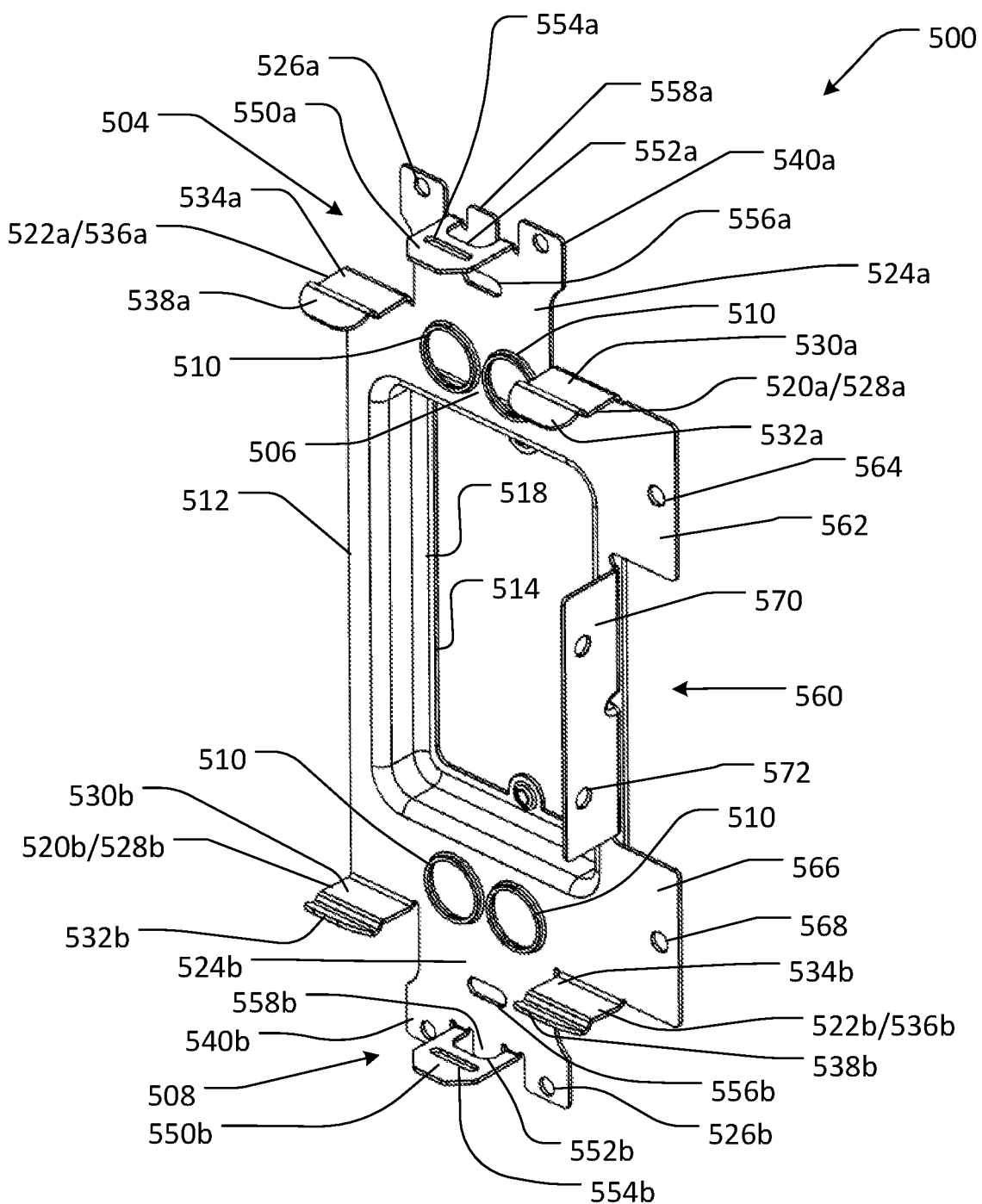
FIG. 27 is a rear isometric view of the mounting bracket of FIG. 25.
Figure 28A:
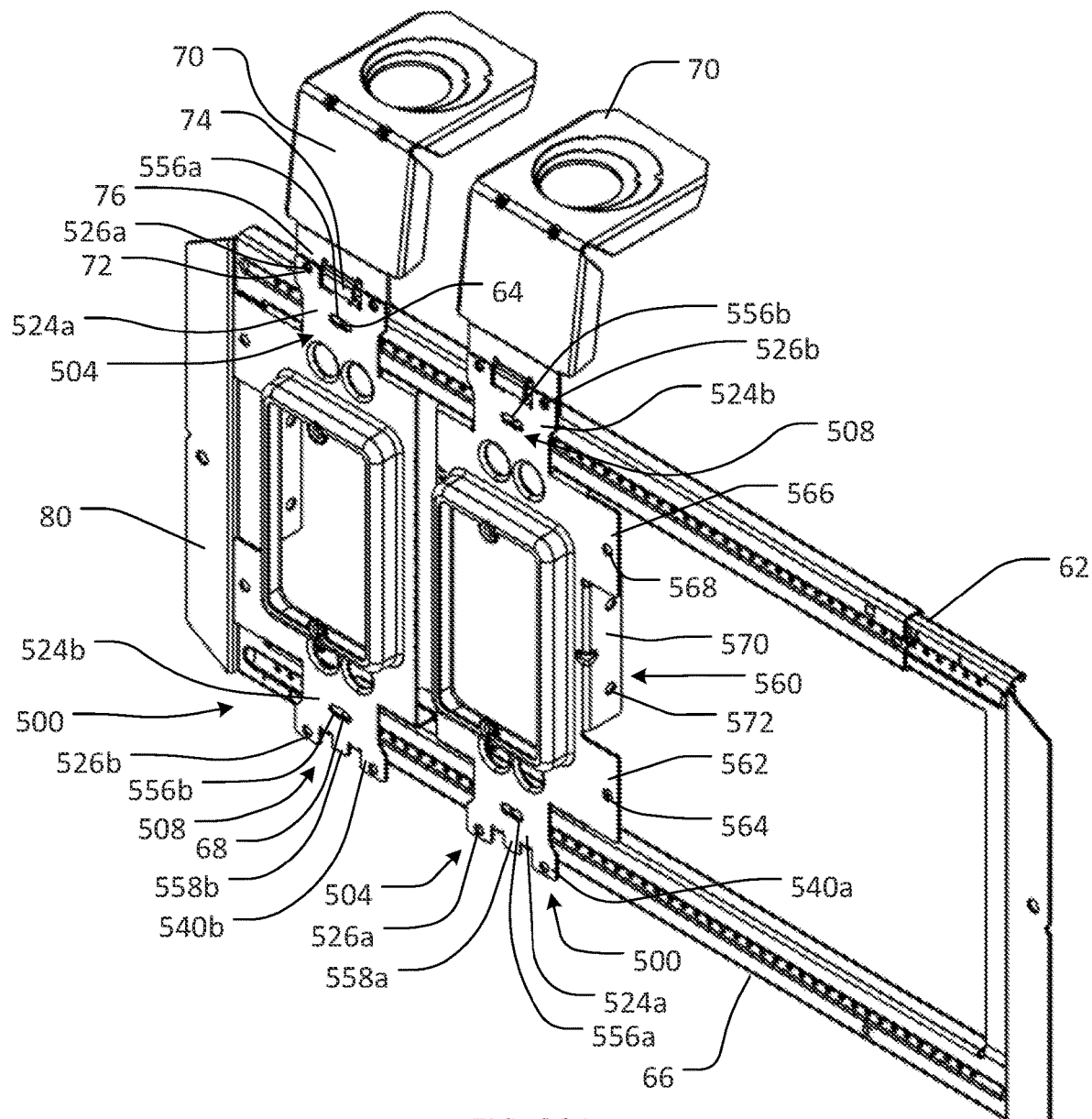
FIG. 28A is a front isometric view of the mounting bracket of FIG. 25 with a support and a support attachment.
Figure 28B:
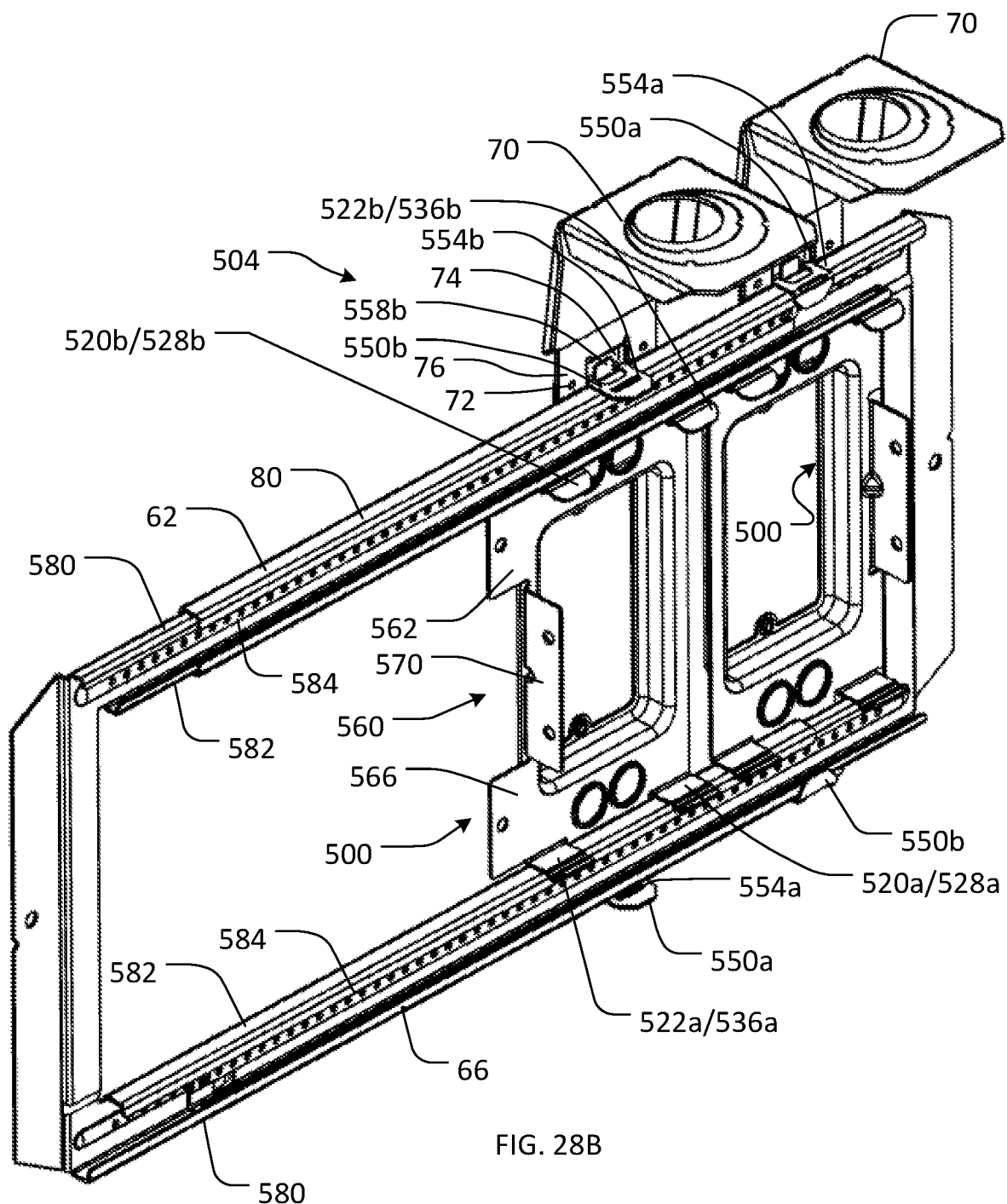
FIG. 28B is a rear isometric view of the mounting bracket of FIG. 25 with a support and a support attachment.
Figure 29:
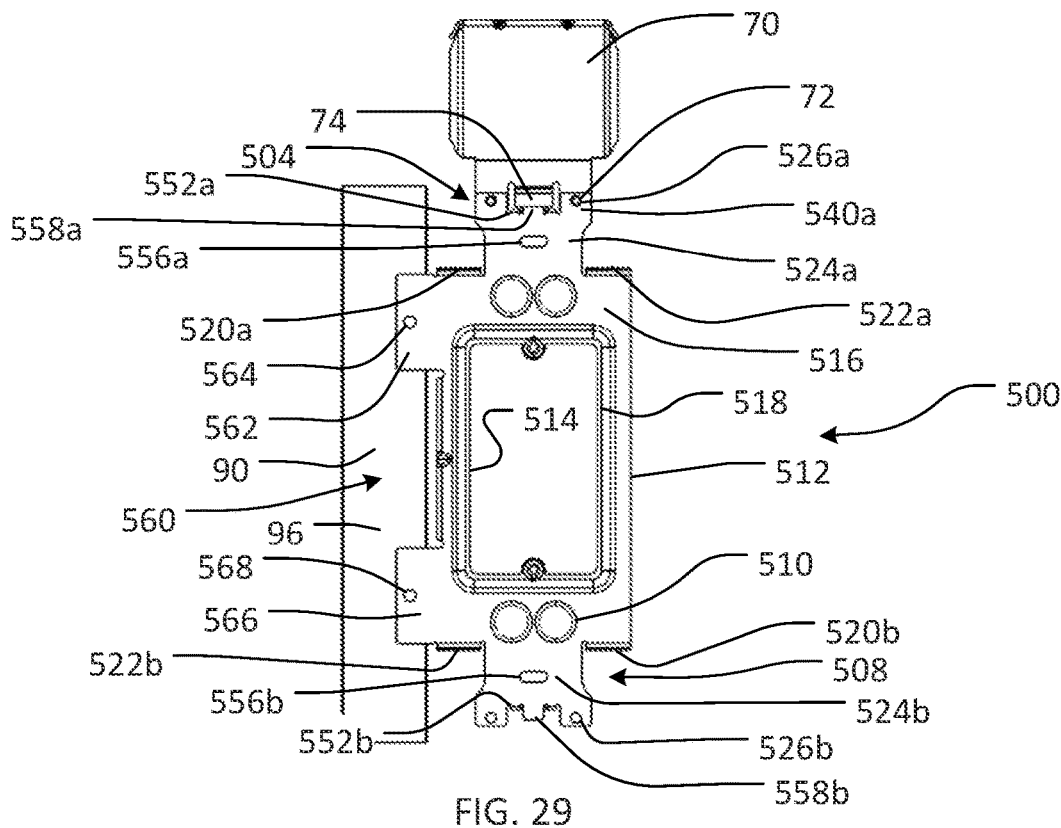
FIG. 29 is a front elevation view of the mounting bracket of FIG. 25 in a first orientation with a stud and a support attachment.
Figure 30:
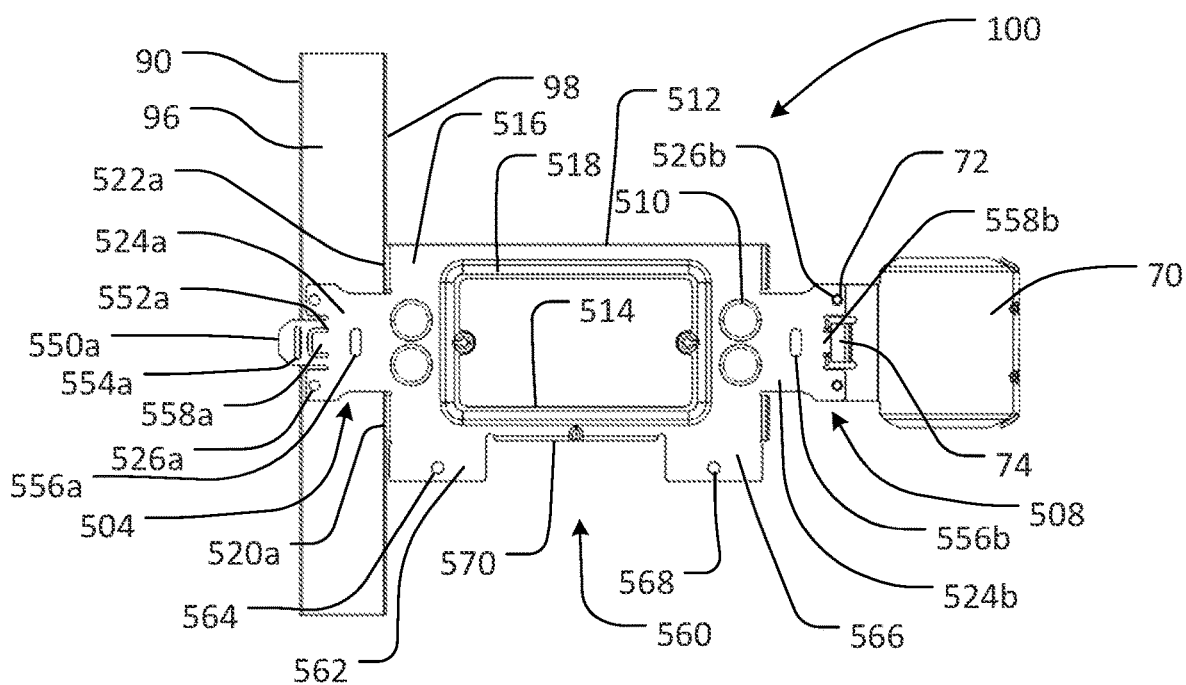
FIG. 30 is a front elevation view of the mounting bracket of FIG. 25 in a second orientation with a stud and a support attachment.
Figure 31:
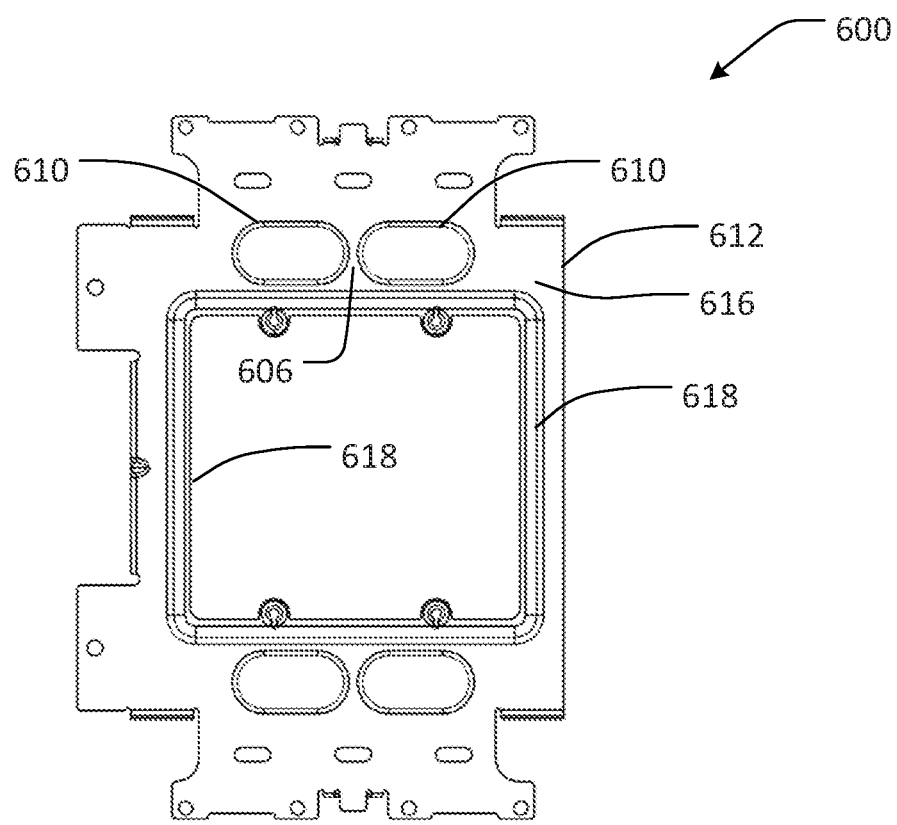
FIG. 31 is a front elevation view of another mounting bracket according to an embodiment of the invention.
Figure 32:
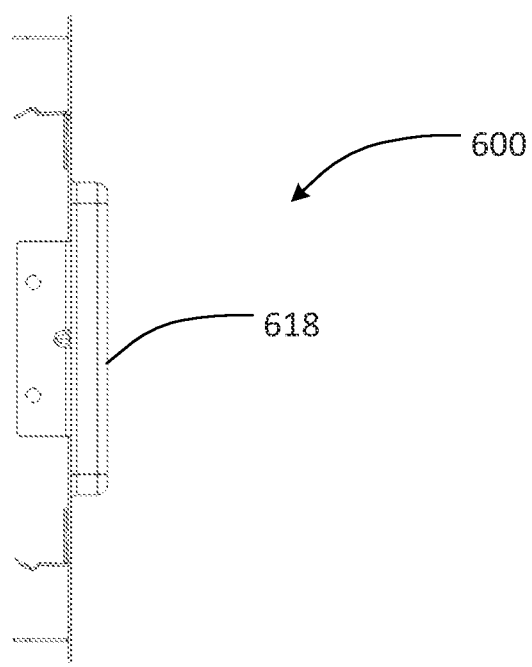
FIG. 32 is a side elevation view of the mounting bracket FIG. 31.
Figure 33:
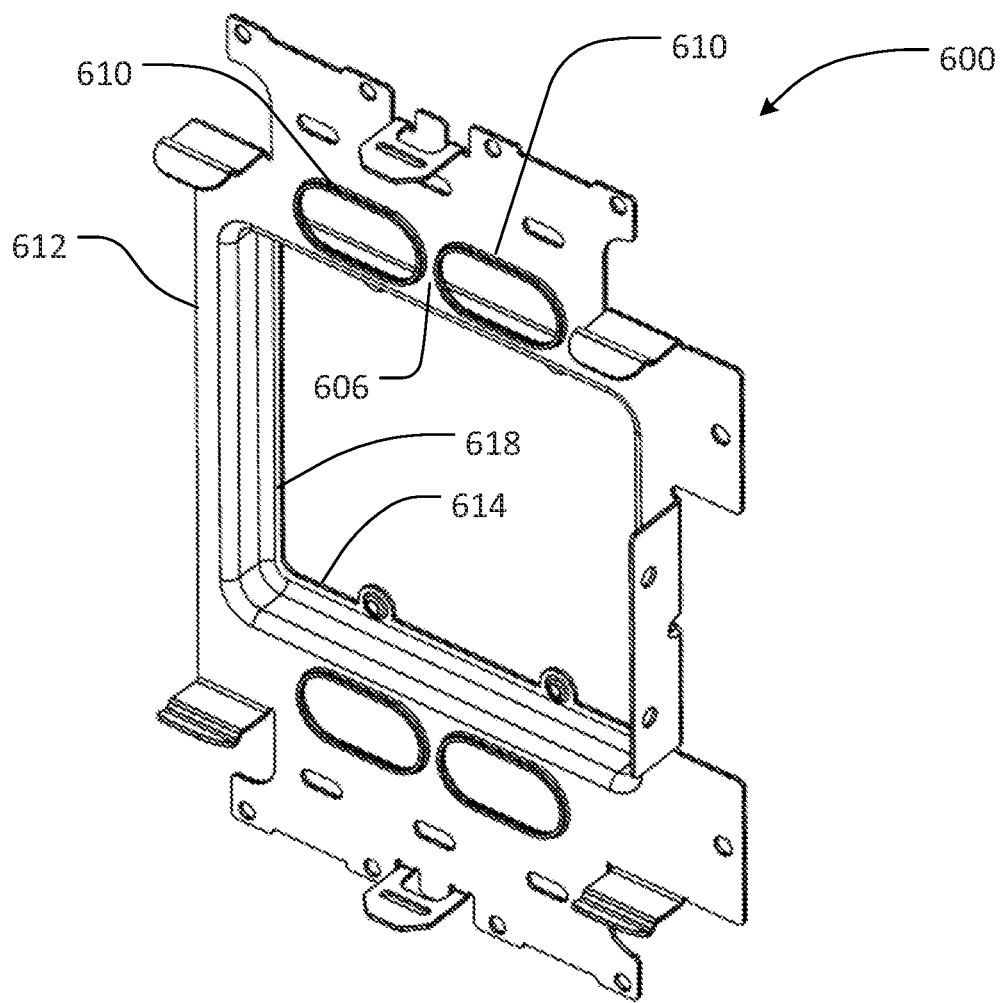
FIG. 33 is a rear isometric view of the mounting bracket of FIG. 31.
Figure 34:
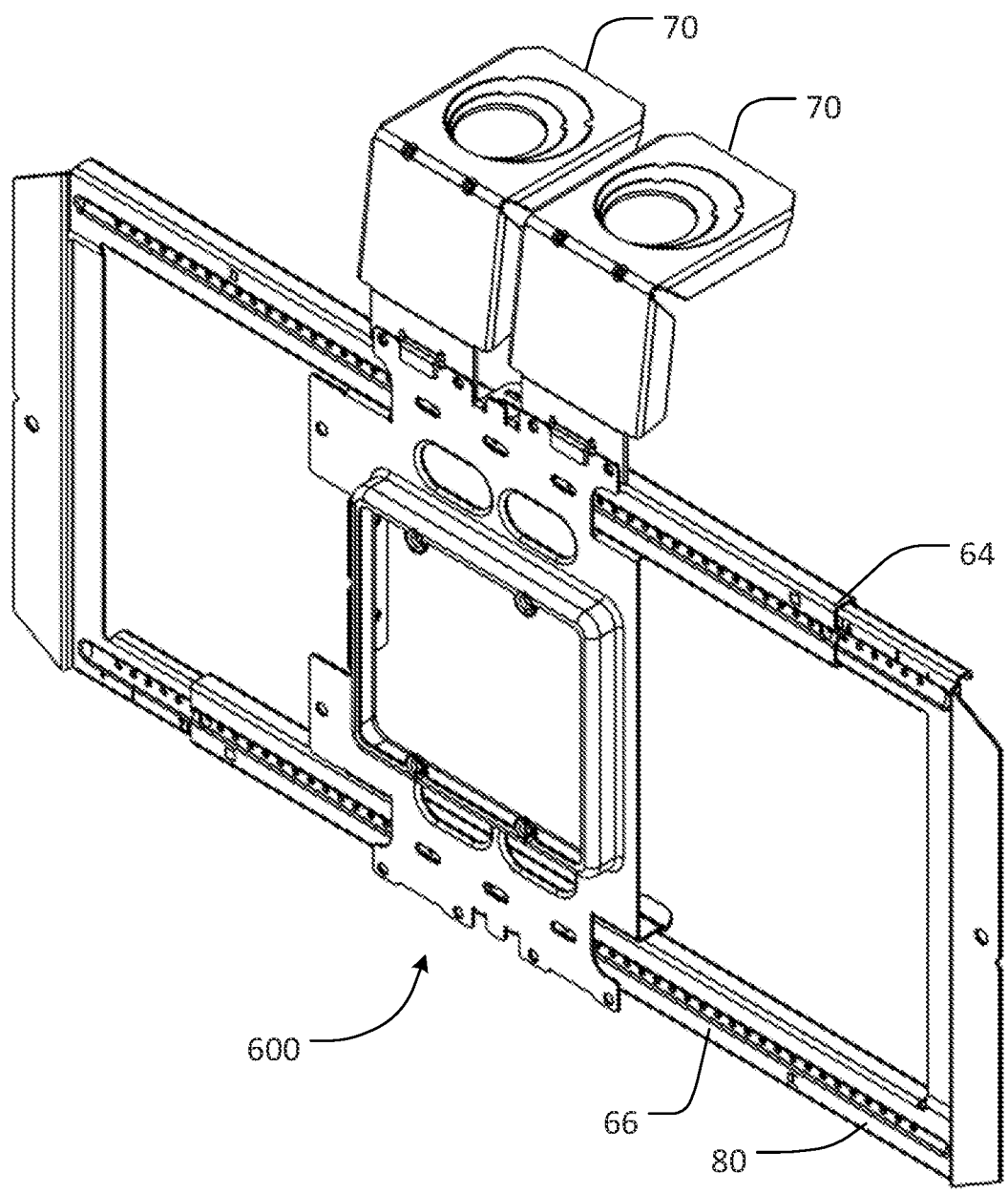
FIG. 34 is a front isometric view of the mounting bracket of FIG. 31 with a support and support attachments.
Figure 35:
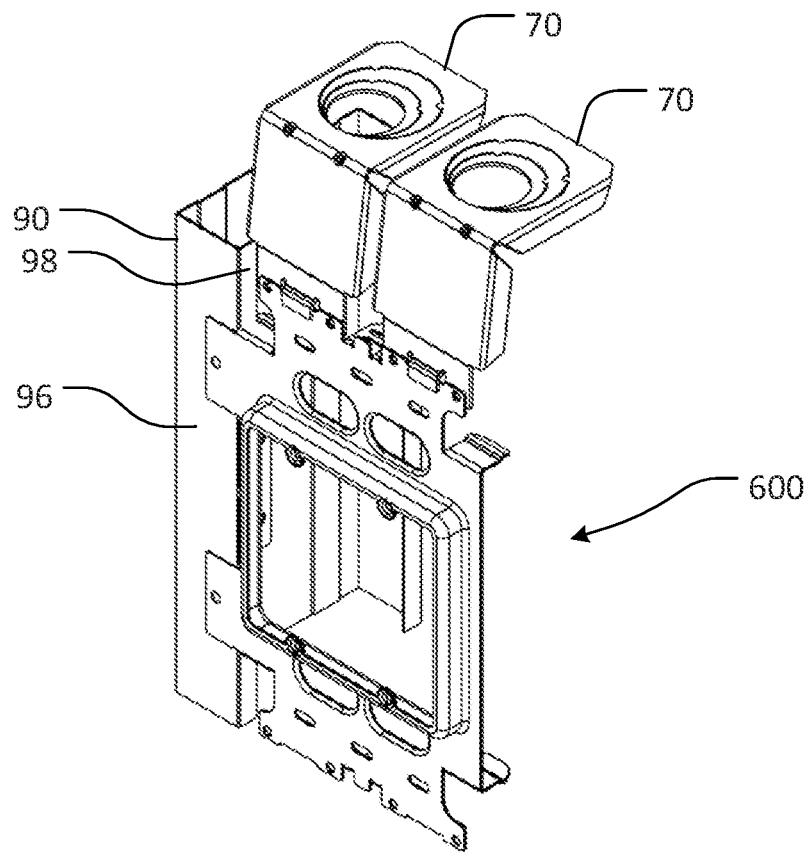
FIG. 35 is a front isometric view of the mounting bracket of FIG. 31 in a first orientation with a stud and support attachments.
Figure 36:
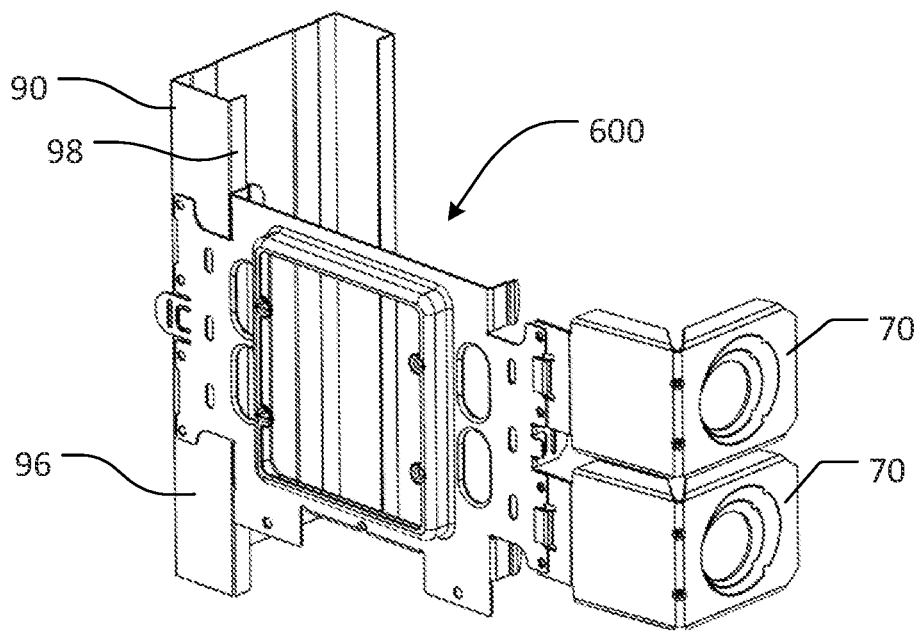
FIG. 36 is a front isometric view of the mounting bracket of FIG. 31 in a second orientation with a stud and support attachments.
Figure 37:
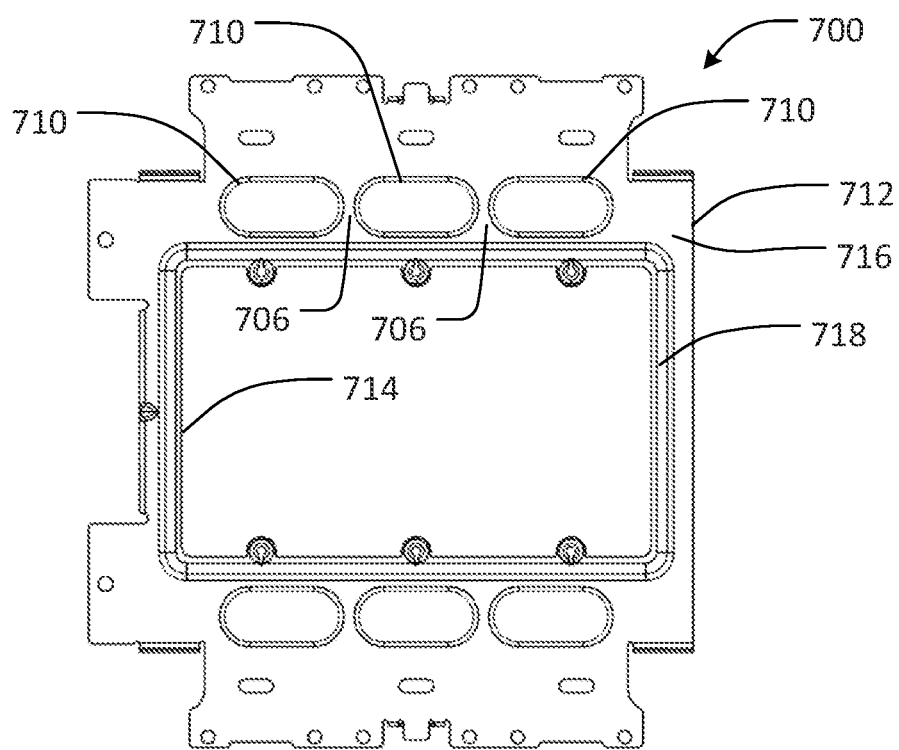
FIG. 37 is a front elevation view of another mounting bracket according to an embodiment of the invention.
Figure 38:
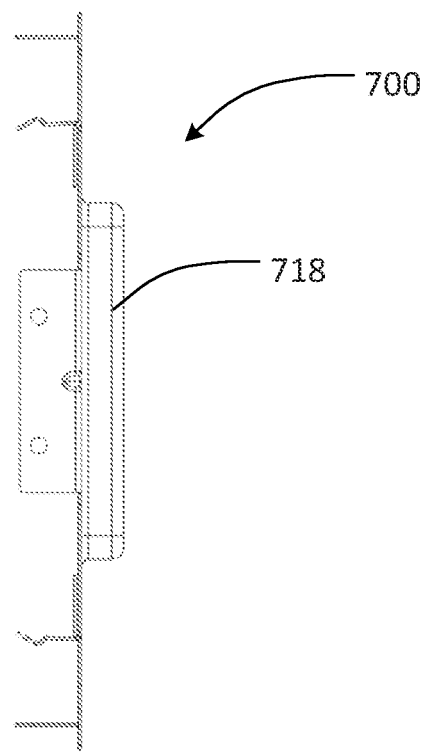
FIG. 38 is a side elevation view of the mounting bracket FIG. 37.
Figure 39:
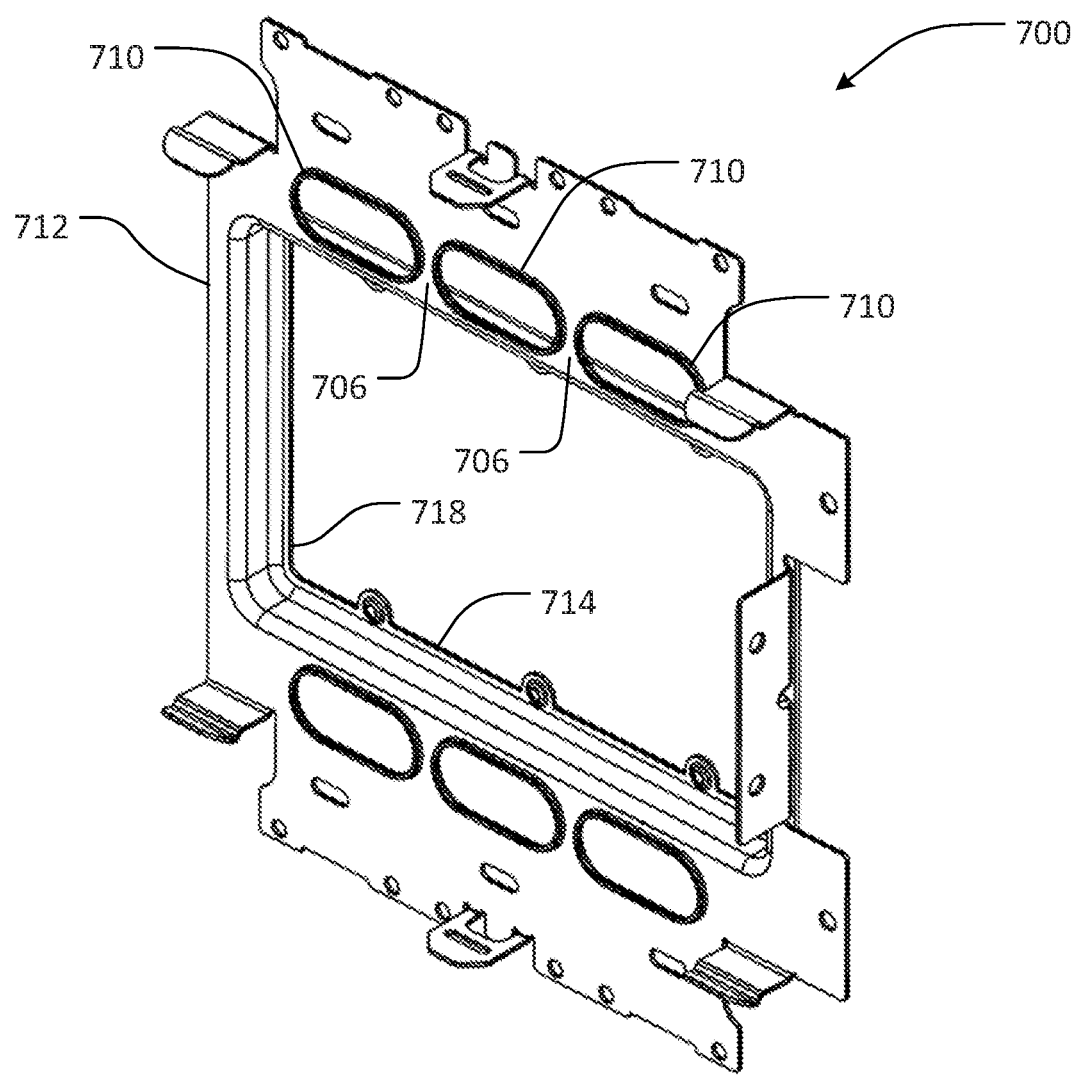
FIG. 39 is a rear isometric view of the mounting bracket of FIG. 37.
Figure 40:
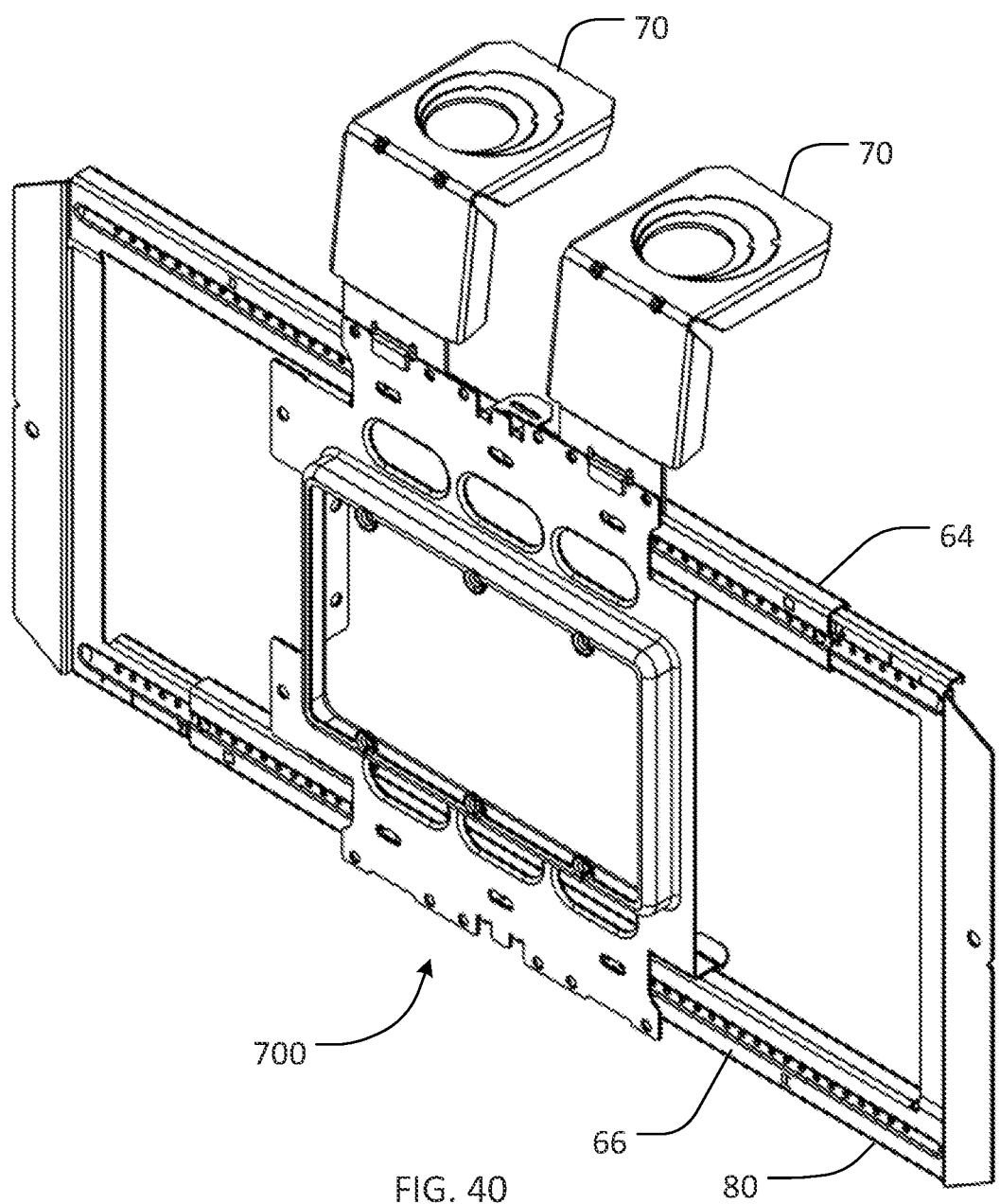
FIG. 40 is a front isometric view of the mounting bracket of FIG. 37 with a support and support attachments.
Figure 41:
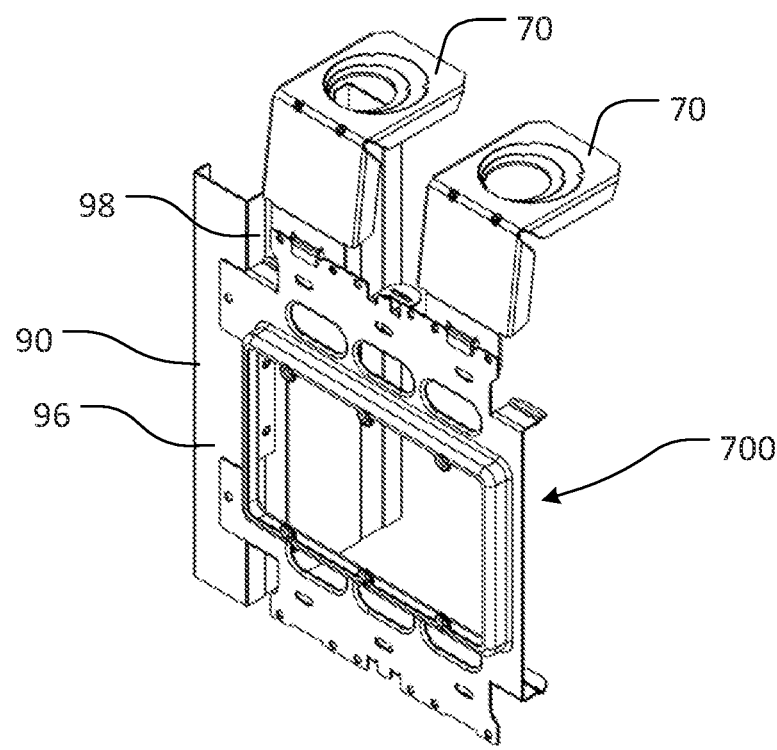
FIG. 41 is a front isometric view of the mounting bracket of FIG. 37 in a first orientation with a stud and support attachments.
Figure 42:
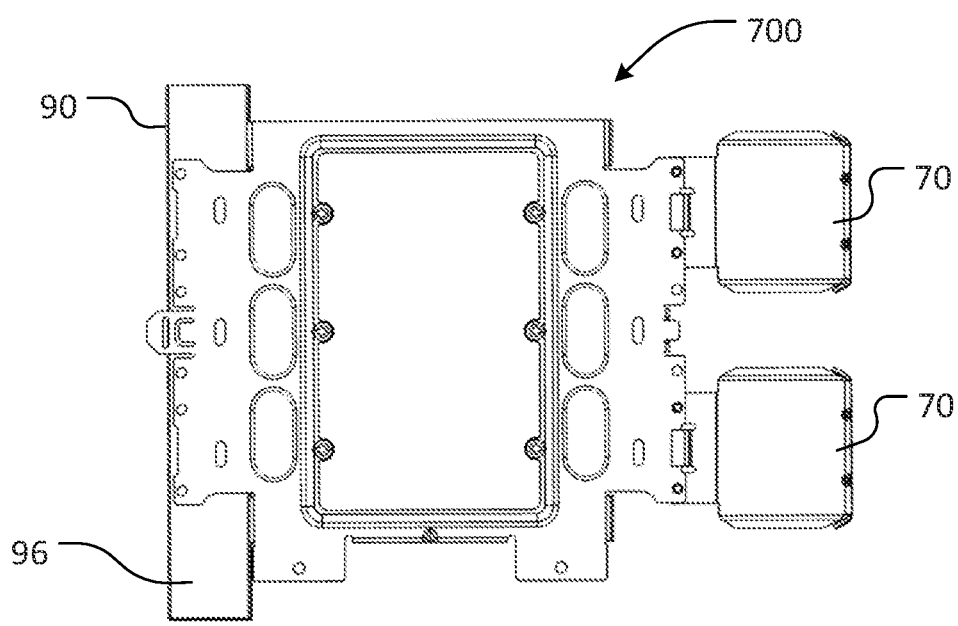
FIG. 42 is a front elevation view of the mounting bracket of FIG. 37 in a second orientation with a stud and support attachments.
Figure 43:
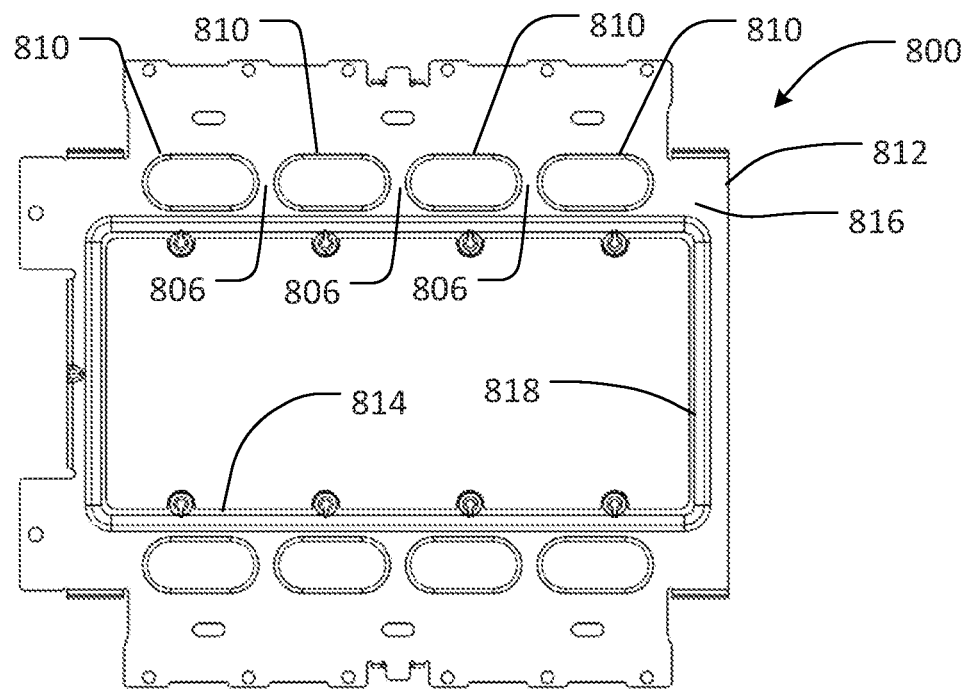
FIG. 43 is a front elevation view of another mounting bracket according to an embodiment of the invention.
Figure 44:
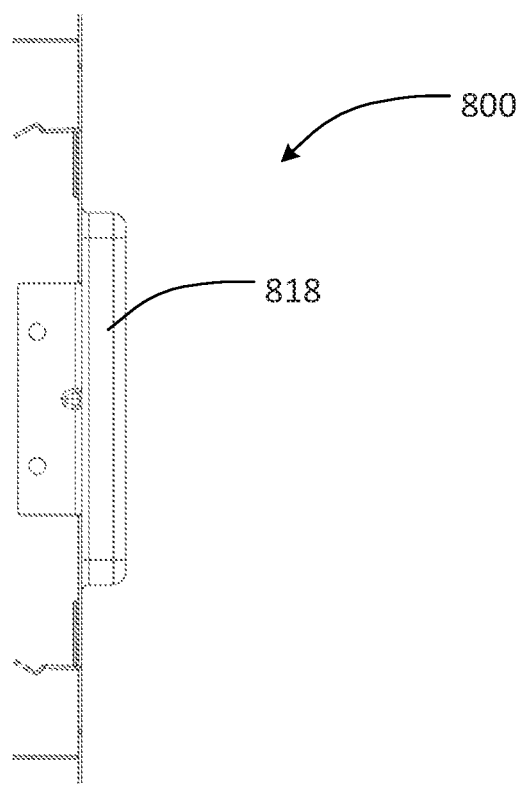
FIG. 44 is a side elevation view of the mounting bracket FIG. 43.
Figure 45:
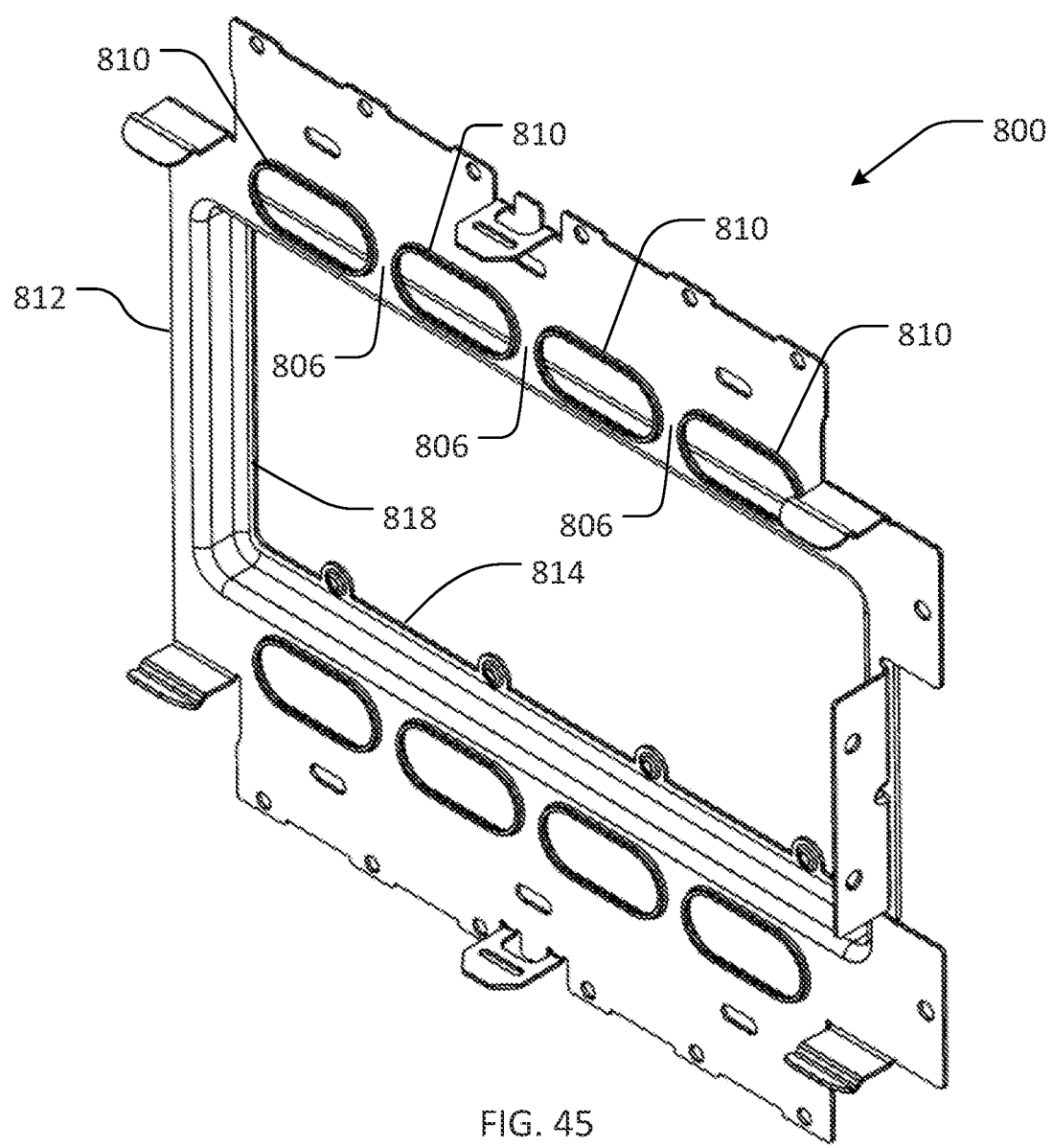
FIG. 45 is a rear isometric view of the mounting bracket of FIG. 43.
Figure 46:
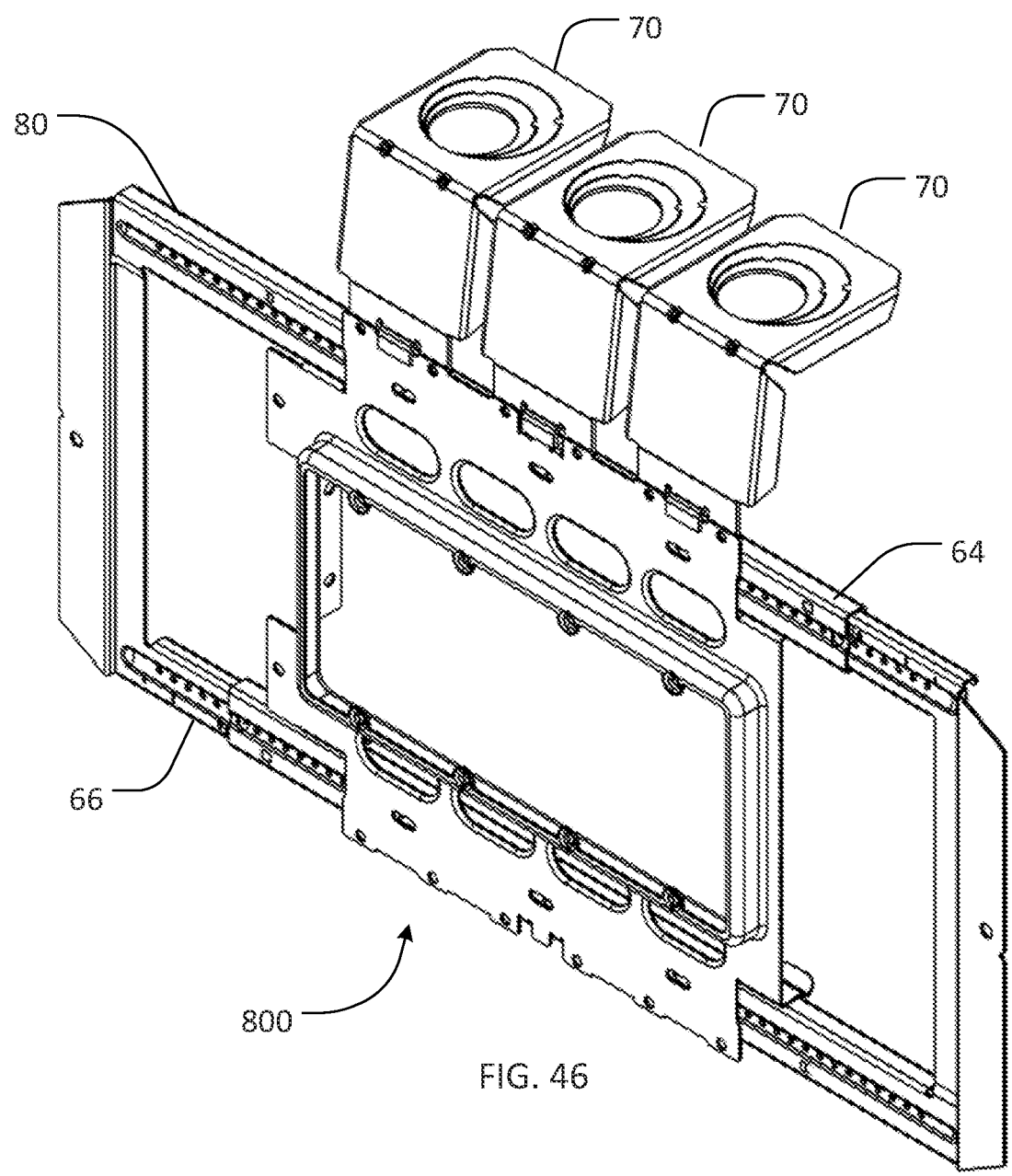
FIG. 46 is a front isometric view of the mounting bracket of FIG. 43 with a support and support attachments.
Figure 47:
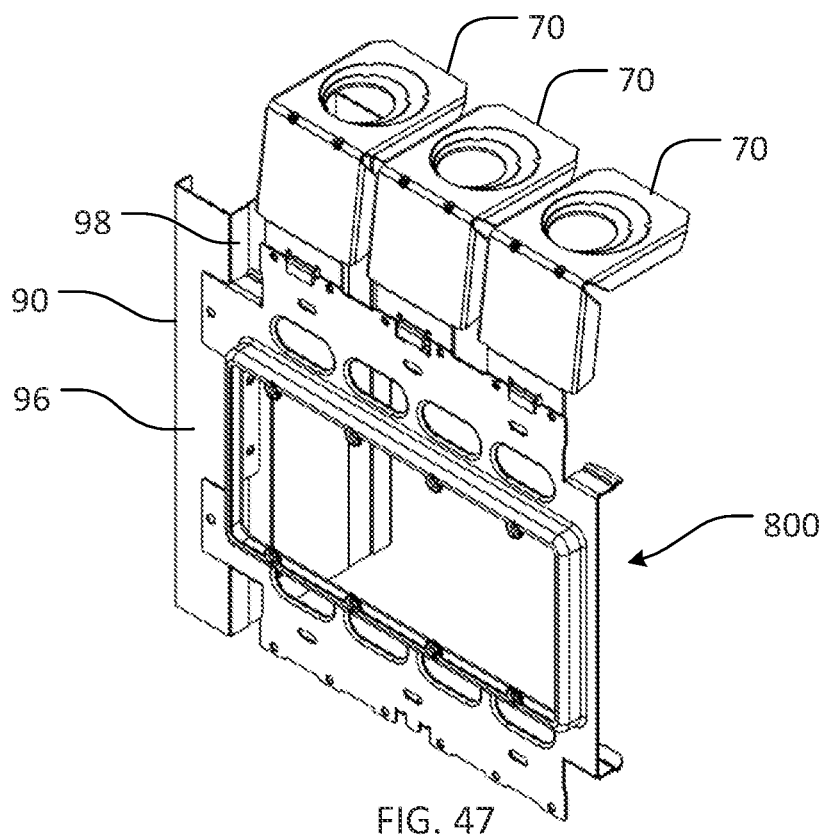
FIG. 47 is a front isometric view of the mounting bracket of FIG. 43 in a first orientation with a stud and support attachments.
Figure 48:
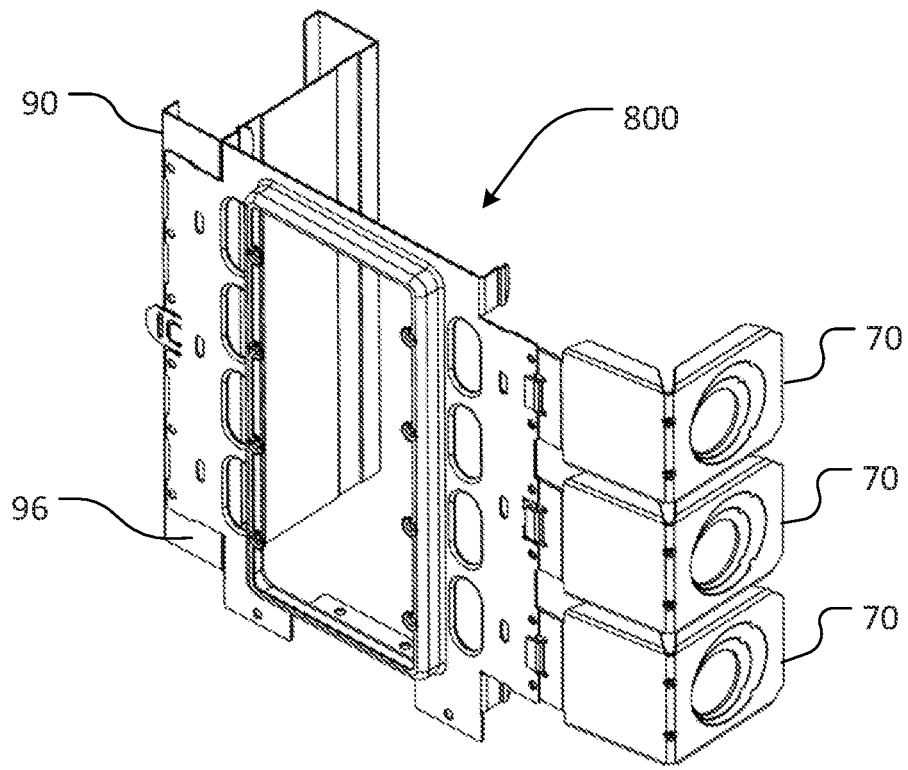
FIG. 48 is a front isometric view of the mounting bracket of FIG. 43 in a second orientation with a stud and support attachments.

The third tab 170 (shown in FIG. 3) can be attached to either the closed side or the open side of a metal stud. For example, FIG. 12 shows a mounting bracket 200, similar to the mounting bracket 100, attached to an open side of the stud 90 with a third attachment device 260. And FIG. 17 shows a mounting bracket 300, also similar to the mounting bracket 100, attached to a closed side of the stud 90 with a third attachment device 360. Generally, the set of holes 172 are configured for use primarily with the closed side of a metal stud.

In FIG. 6, the mounting bracket 100 is attached to the stud 90 with the first attachment device 104 and, correspondingly, is rotated 90° relative to the configuration shown in FIG. 5. With the third arm 150*a* in an unbent configuration, at least a part of the first attachment device 104 sits flush against the face 96 of the stud 90. For example, a portion of the third arm 150*a* and the connecting wall 124*a* are depicted sitting flush against the front face 96 of the stud 90. The first and second arms 120*a*, 122*a* of the first attachment device 104 extend along the side 98 of the stud 90. The first and second arms 120*a*, 122*a* can thus provide additional support and maintain a perpendicular orientation with respect to the stud 90. A fastener (not shown) can be received through the slot 156*a* in the connecting wall 124*a* (see also FIG. 5) to secure the mounting bracket 100 to the stud 90. In some cases, depending on the width of a stud, the third arm 150a can be bent at bending feature 154a to contact the other side of the stud opposite the side along which the first and second arms 120a, 122b extend. Although not shown, the mounting bracket 100 can be similarly attached to the stud 90 with the second attachment device 108, in an orientation that is rotated 180° relative to that shown in FIG. 6. The support attachment 70 is also shown attached to the second attachment device 104 as described above.

It should be understood that the mounting bracket 100 can be attached to the stud 90 in different orientations. For example, the mounting bracket 100 can be attached to one side of the stud 90 with the third attachment device 160 with the first attachment device 104 orientated on top and the second attachment device 108 on bottom as shown in FIG. 5. Alternatively, the mounting bracket 100 can be attached to the opposite side of the stud 90 with the third attachment device 160 with the second attachment device 108 oriented on top and the first attachment device 104 on bottom.

Further, the mounting bracket 100 is symmetrical about a symmetry line 174. This allows for attaching the mounting bracket 100 to the stud 90 in different orientations while maintaining the same relative position of the mud ring 118 to the stud 90. For example, the mounting bracket 100 can be attached to the stud 90 with the first attachment device 104 as shown in FIG. 6 with the third attachment device 160 on the bottom. However, the mounting bracket 100 can be rotated 180 degrees and can be similarly connected to the stud 90 with the second attachment device 108 and the third attachment device 160 on the top. Moreover, the first and second attachment devices 104, 108 can be similarly attached to the opposite side of the stud 90, wherein when attached with the first attachment device 104, the third attachment device 160 is on the bottom and when attached with the second attachment device 108, the third attachment device 160 is on the top.

In the illustrated embodiment, as also mentioned above, the mounting bracket 100 is integrally formed (e.g., stamped) as a single piece of mild steel. Accordingly, the attachment devices 104, 108 and other features extend continuously from the mounting body 112. In other embodiments, however, other methods of manufacturing and materials can be used and other configurations of attachment devices are accordingly possible.

In some embodiments, mounting brackets can include more than two bendable tabs or fewer than two bendable tabs. In some embodiments, at least one bendable tab can be positioned in a location that is different than the positions of the illustrated bendable tabs. Additionally or alternatively, at least one bendable tab may be configured to be bent without a bending feature.

In some embodiments, the first attachment device 104 and the second attachment device 108 may be sized so that the mounting bracket 100 is slidably movable along the support 80, including when the first and second attachment devices 104, 108 engage the first and second rails 62, 66. This may be useful, for example, in order to adjust the position of the mounting bracket 100 after it is secured to the support 80.

In some embodiments, a mounting bracket can be configured to be somewhat permanently secured to a support using separate fasteners, after being initially staged using integral attachment devices. For example, as described above, the attachment devices 104, 108 and the bendable tabs 150a, 150b can be used to secure the mounting bracket 100 to the support 80, and the mounting bracket 100 then can be slid along the support 80 to a desired location. As desired, a user can then use screws or other separate fasteners to further secure the mounting bracket 100 for final installation (e.g., behind drywall).

FIGS. 7-24 illustrate other mounting brackets configured similarly to and having similar features of the mounting bracket 100. The mounting bracket 200 as shown in FIGS. 7-12 includes a mounting body 212, with a set of apertures 210 and a central opening 214, a mounting face 216, and a mud ring 218 protruding from the mounting face 216 and around the central opening 214. The mud ring 218 is sized to install two electrical devices at the same time (i.e., with a two gang configuration). Further, the area of the mounting body 212 between adjacent apertures 210 defines a bridge 206. The bridge 206 can be configured to be a tie-off location for securing/supporting cables to the mounting bracket 200. For example, an installer can arrange and orient the cables adjacent the bridge 206, pass a cable tie around the cables and through the apertures 210 on either side of the bridge 206, and connect the ends of the cable tie. With the cables and the bridge 206 captured within the cable tie, tightening the cable tie secures the cables against the bridge 206 and therefore to the mounting bracket 200.

FIGS. 13-18 illustrate the mounting bracket 300 including a mounting body 312, with a set of apertures 310 and a central opening 314, a mounting face 316, and a mud ring 318 protruding from the mounting face 316 and around the central opening 314. The mud ring 318 is sized to install three electrical devices at the same time (i.e., with a three gang configuration). Further, and similar to the mounting bracket 200, the area of the mounting body 312 between adjacent apertures 310 defines a bridge 306 that can be configured to be a tie-off location for securing/supporting cables to the mounting bracket 300.

A mounting bracket 400 is shown in FIGS. 19-24. The mounting bracket 400 includes a mounting body 412, with a set of apertures 410 and a central opening 414, a mounting face 416, and a mud ring 418 protruding from the mounting face 416 and around the central opening 414. The mud ring 418 is sized to install four electrical devices at the same time (i.e., with a four gang configuration). Additionally, the area of the mounting body 412 between adjacent apertures 410 defines a bridge 406 that can be configured to be a tie-off location for securing/supporting cables to the mounting bracket 400.

The scope of this disclosure should not be limited to only these embodiments however, as it can be seen that the features as described with respect to the mounting bracket 100 can be applied to mounting brackets that can install multiple electrical devices.

FIGS. 25-30 illustrate another embodiment of a mounting bracket 500 according to the invention, as also can be attached to a support (e.g., the support 80) and a stud (e.g., the stud 90) in multiple orientations. As shown in FIG. 28B, each of the rails 62, 66 exhibit a side 580 (e.g. top), a side 582 (e.g., bottom), a side 584 (e.g., back). In many aspects, the mounting bracket 500 is similar to the mounting bracket 100 described above and similar numbering in the 500 series is used for the mounting bracket 500. For example, the mounting bracket 500 has a mounting body 512 with a central opening 514, a mounting face 516, and an integral mud ring 518. Additionally, the mounting bracket 500 has a first attachment device 504 and a second attachment device 508. The first attachment device 504 has arms 520a, 522a, which include fingers 528a, 536a with horizontal segments 530a, 534a and angled engagement features 532a, 538a. The first attachment device 504 also has a connecting wall 524a with holes 526a and a slot 556a and an arm 550a, with a bending feature 554a, extending from the connecting wall 524a and vertically spaced from and positioned laterally between the arm 520a and the arm 522a. The second device 508 has arms 520b, 522b, which include fingers 528b, 536b with horizontal segments 530b, 534b and angled engagement features 532b, 538b. The second attachment device 508 also has a connecting wall 524b with holes 526b and a slot 556b and an arm 550b, with a bending feature 554b, extending from the connecting wall 524b and vertically spaced from and positioned laterally between the arm 520b and the arm 522b. The mounting bracket 500 also includes a third attachment device 560 having a first tab 562 with a hole 564, a second tab 566 with a hole 568, and a third tab 570 with a set of holes 572. Additionally, the mounting bracket 500 is symmetrical about a symmetry line 574.

In some aspects, however, the brackets 100, 500 differ from each other. For example, the arms 550a, 550b have a bending feature 552a, 552b that defines a projection 558a, 558b. When the arms 550a, 550b are bent back at the bending features 552a, 552b, the projections 558a, 558b, around which the bending features 552a, 552b are formed as cut-outs, remain in place, extending from the mounting body 120 in a co-planar relationship with the connecting walls 124a, 124b. The projections 558a, 558b are configured to interact with a flap 74 of the support attachment 70 positioned between sets of ears 76 to retain the support attachment 70 in place. For example, looking at FIGS. 28A and 28B, the projection 558a and the ears 540a of the connecting wall 524a are in an interleaved engagement with the flap 74 and the set of ears 78, wherein when viewed from the direction in FIG. 28A, the projection 558a is positioned behind the flap 74. This arrangement allows a user to position the support attachment 70 on the mounting bracket 500 and insert the fasteners (not shown) through the holes 526a in the ears 540a of the mounting bracket 500 and into engagement with the holes 72 in the ears 76 of the support mechanism 70. Because the flap 74 contacts the projection 558a, the support mechanism 70 stays in place and does not move out of alignment or away from the mounting bracket 500 when the user is connecting the support attachment 70 to the mounting bracket 500 In other embodiments, one or both of the projections 558a, 558b can be excluded, as appropriate, or one or more similarly positioned projections can be configured to engage with different additional attachments.

Additionally, another difference between the brackets 100, 500 is that the aperture in the mounting body 512 includes a set of apertures 510. The area of the mounting body 512 between adjacent apertures 510 defines a bridge 506. The bridge 506 can be configured to be a tie-off location for securing/supporting cables to the mounting bracket 500. For example, and similar to the bridge 206 in the mounting bracket 200, an installer can arrange and orient the cables adjacent the bridge 506, pass a cable tie around the cables and through the apertures 510 on either side of the bridge 506, and connect the ends of the cable tie. With the cables and the bridge 506 captured within the cable tie, tightening the cable tie secures the cables against the bridge 506 and therefore to the mounting bracket 500.

FIGS. 31-48 illustrate other mounting brackets configured similarly to and having similar features of the mounting bracket 500. A mounting bracket 600 as shown in FIGS. 31-36 includes a mounting body 612, with a set of apertures 610, bridges 606, and a central opening 614, a mounting face 616, and a mud ring 618 protruding from the mounting face 616 and around the central opening 614. The mud ring 618 is integrally formed there around and sized to install two electrical devices at the same time (i.e., with a two gang configuration and similar to the mounting bracket 200). FIGS. 37-42 illustrate a mounting bracket 700 with a mounting body 712, with a set of apertures 710, bridges 706, and a central opening 714, a mounting face 716, and a mud ring 718 protruding from the mounting face 716 and around the central opening 714. The mud ring 718 is integrally formed there around and sized to install three electrical devices at the same time (i.e., with a three gang configuration). A mounting bracket 800 shown in FIGS. 43-48 includes a mounting body 812, with a set of apertures 810, bridges 806, and a central opening 814, a mounting face 816, and a mud ring 818 protruding from the mounting face 816 and around the central opening 814. The mud ring 818 is integrally formed around the opening 814 and sized to install four electrical devices at the same time (i.e., with a four gang configuration). The scope of this disclosure should not be limited to only these embodiments however, as it can be seen that the features as described with respect to the mounting bracket 500 can be applied to mounting brackets that can install multiple electrical devices.

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system.

For example, with reference to FIGS. 4A and 4B, some embodiments can include an installation method under which a user can install the mounting bracket 100 to the support 80. The method can include engaging the first attachment device 104 of the mounting bracket 100 with the first rail 62 of the support 80 and engaging the second attachment device 108 of the mounting bracket 100 with the second rail 66 of the support 80. Another example, with reference to FIG. 5, can include installation of the bracket 100 to the stud 90 with the third attachment device 160, wherein the first and second tabs 162, 166 sit flush against the face 96 of the stud 90 and the third tab 170 sits flush against the side 98 of the stud 90. Then the first and second tabs 162, 166 can be secured to the face 96 of the stud 90 with fasteners received through holes 164, 168 in the first and second tabs 162, 166 and the third tab 170 can be secured to the side 98 of the stud 90 with fasteners received through a set of holes 172 in the third tab 170. In the illustrated embodiment, the holes 172 are arranged to be used with fasteners to engage a closed side of the stud 90 and may not be sized for similar engagement with an open side of the stud 90. In other embodiments, however, other configurations are possible.

Another example, with reference to FIG. 6, can include installation of the bracket 100 to the stud 90 with the first or second attachment device 104, 108. With the bendable tab 150a, 150b of one of the first or second attachment devices 104, 108 in an unbent configuration, at least a part of the one first or second attachment devices 104, 108 can be seated flush against the face 96 of the stud 90. Further, the first arm 120a, 120b and the second arm 122a, 122b can be seated against the side 98 of the stud 90. Then the first or second attachment device 104, 108 can be secured to the stud 90 with a fastener received through the slot 156*a*, 156*b* in the first or second attachment device 104, 108.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A mounting bracket for an electrical device, for use with a support having an upper rail and a lower rail that is spaced apart from the upper rail, the mounting bracket comprising:
   a mounting body configured to secure the electrical device to the mounting bracket between the upper and lower rails when the mounting bracket is secured to the support, the mounting body including a mounting face to support the electrical device;
   a first attachment device connected to the mounting body, the first attachment device configured to selectively engage either of the upper rail or the lower rail to secure the mounting bracket to the support; and
   a second attachment device connected to the mounting body opposite the first attachment device, the second attachment device configured to selectively engage either of the other of the upper rail or the lower rail to secure the mounting bracket to the support;
   each of the first and second attachment devices including, respectively:
      a first arm configured to extend along and engage with a first side of the corresponding upper or lower rail; and
      a second arm, wherein the second arm includes a bendable tab, configured to extend along and engage with a second side of the corresponding upper or lower rail that is opposite the first side;
      the first arm extending past the bendable tab when the bendable tab is in a bent configuration.

2. The mounting bracket of claim 1, for use with the support having a first support member and a second support member that are nested together and are configured to be moved telescopically relative to one another to alter the length of the support, each of the first and second support members having a first rail and a second rail, the second rail of each of the first and second support members being configured to be slidably received within the first rail of the other of the first and second support members to define the upper and lower rails of the support,
   wherein each of the first and second attachment devices is sized to resiliently engage with either of the first or second rails, along either of the corresponding upper or lower rails, to secure the mounting bracket to the support.

3. The mounting bracket of claim 1, wherein at least one of the first or second attachment devices further comprises a third arm configured to extend along and engage with the first side of the corresponding upper or lower rail;
   wherein the third arm is spaced laterally apart from the first arm.

4. The mounting bracket of claim 1, further for use with a stud, wherein, with the bendable tab of one of the first or second attachment devices in an unbent configuration, at least a part of the one of the first or second attachment devices is configured to sit flush against a face of the stud.

5. The mounting bracket of claim 4, wherein the first arm of the one first or second attachment devices is configured to extend along a side of the stud when the at least part of the one of the first or second attachment devices is seated flush against the face of the stud.

6. The mounting bracket of claim 1, further for use with a stud and further comprising:
   a third attachment device with a first tab extending laterally from the mounting body adjacent one of the first or second attachment devices; and
   a second tab extending rearwardly away from the mounting face;
   wherein the first tab is configured to sit flush against a face of the stud and the second tab is configured to sit flush against a side of the stud.

7. The mounting bracket of claim 1, further comprising a set of apertures extending through the mounting body, wherein the set of apertures define a bridge configured to support a cable.

8. A mounting bracket for an electrical device, for use with a support having an upper rail and a lower rail that is spaced apart from the upper rail, the mounting bracket comprising:
   a mounting body configured to secure the electrical device to the mounting bracket between the upper and lower rails when the mounting bracket is secured to the support, the mounting body including a mounting face to support the electrical device;
   a first attachment device connected to the mounting body, the first attachment device configured to selectively engage either of the upper rail or the lower rail to secure the mounting bracket to the support; and
   a second attachment device connected to the mounting body opposite the first attachment device, the second attachment device configured to selectively engage either of the other of the upper rail or the lower rail to secure the mounting bracket to the support;
   each of the first and second attachment devices including, respectively:
      a first arm configured to extend along and engage with a first side of the corresponding upper or lower rail; and
      a second arm configured to extend along and engage with a second side of the corresponding upper or lower rail that is opposite the first side;
      the first and second attachment devices each including a projection and a set of ears that extend away from the mounting body and are perpendicular to the second arm.

9. The mounting bracket of claim 8, wherein the mounting body has a mounting face, a central opening, and a mud ring, the mud ring protruding from the mounting face and around the central opening.

10. The mounting bracket of claim 9, wherein the mud ring is integrally formed with the mounting body.

11. The mounting bracket of claim 8, wherein the first and second attachment devices each include a slot configured to align with a hole in the upper rail or the lower rail and receive a fastener therein.

12. The mounting bracket of claim 11, wherein the mounting body has a central opening to receive the electrical device and the first and second attachment devices each include an aperture spaced between the slot and the central opening.

13. The mounting bracket of claim 12, wherein each of the apertures is one in a set of apertures on the first and second attachment devices, each set of apertures defining a bridge configured to support a cable.

14. The mounting bracket of claim 8, wherein the projection is positioned between the set of ears; and
wherein at least one of the first or second attachment devices is configured to be attachable to a support attachment with an interleaved engagement with the projection and the set of ears, the support attachment configured to support a conduit or a cable.

15. The mounting bracket of claim 8, further for use with a stud, wherein, at least a part of the one of the first or second attachment devices is configured to sit flush against a face of the stud; and
wherein the first arm of the one first or second attachment devices is configured to extend along a side of the stud when the at least part of the one of the first or second attachment devices is seated flush against the face of the stud.

16. The mounting bracket of claim 8, further for use with a stud and further comprising:
a third attachment device with a first tab extending laterally from the mounting body adjacent one of the first or second attachment devices; and
a second tab extending rearwardly away from the mounting face;
wherein the first tab is configured to sit flush against a face of the stud and the second tab is configured to sit flush against a side of the stud.

17. A method for installing a mounting bracket for a low voltage electrical device on a support having an upper rail and a lower rail that is spaced apart from the upper rail, the method comprising:
engaging a first attachment device of the mounting bracket with the upper rail from a front side of the upper rail, wherein the first attachment device includes a first arm extending along and engaging with a first side of the upper rail and a second arm extending along and engaging with a second side of the upper rail opposite the first side;
after engaging the first attachment device with the upper rail, bending a bendable tab of the second arm of the first attachment device to engage a back side of the upper rail that extends between the first side and second side so the first arm of the first attachment device extends past the bendable tab; and
engaging a second attachment device of the mounting bracket with the lower rail.

18. A mounting bracket for an electrical device, for use with a support having an upper rail and a lower rail that is spaced apart from the upper rail, the mounting bracket comprising:
a mounting body configured to secure the electrical device to the mounting bracket between the upper and lower rails when the mounting bracket is secured to the support, the mounting body including a mounting face to support the electrical device;
a first attachment device connected to the mounting body, the first attachment device configured to selectively engage either of the upper rail or the lower rail to secure the mounting bracket to the support;
a second attachment device connected to the mounting body opposite the first attachment device, the second attachment device configured to selectively engage either of the other of the upper rail or the lower rail to secure the mounting bracket to the support;
each of the first and second attachment devices including, respectively:
a first arm configured to extend along and engage with a first side of the corresponding upper or lower rail;
a second arm configured to extend along and engage with a second side of the corresponding upper or lower rail that is opposite the first side; and
a slot configured to align with a hole in the upper rail or the lower rail and receive a fastener therein.

19. A mounting bracket for an electrical device, for use with a support having an upper rail and a lower rail that is spaced apart from the upper rail, the mounting bracket comprising:
a mounting body configured to secure the electrical device to the mounting bracket between the upper and lower rails when the mounting bracket is secured to the support, the mounting body including a mounting face to support the electrical device;
a first attachment device connected to the mounting body, the first attachment device configured to selectively engage either of the upper rail or the lower rail to secure the mounting bracket to the support; and
a second attachment device connected to the mounting body opposite the first attachment device, the second attachment device configured to selectively engage either of the other of the upper rail or the lower rail to secure the mounting bracket to the support;
each of the first and second attachment devices including, respectively:
a first arm configured to extend along and engage with a first side of the corresponding upper or lower rail; and
a second arm, the second arm including a bendable tab, configured to extend along and engage with a second side of the corresponding upper or lower rail that is opposite the first side,
the support having a first support member and a second support member that are nested together, to be movable telescopically relative to one another to alter the length of the support, each of the first and second support members having a first rail and a second rail, the second rail of each of the first and second support members being slidably received within the first rail of the other of the first and second support members to define the upper and lower rails of the support,
wherein each of the first and second attachment devices is sized to resiliently engage with either of the first or second rails, along either of the corresponding upper or lower rails, to secure the mounting bracket to the support.

20. A mounting bracket for an electrical device, for use with a support having an upper rail and a lower rail that is spaced apart from the upper rail, the mounting bracket comprising:
a mounting body configured to secure the electrical device to the mounting bracket between the upper and lower rails when the mounting bracket is secured to the support, the mounting body including a mounting face to support the electrical device;
a first attachment device connected to the mounting body, the first attachment device configured to selectively engage either of the upper rail or the lower rail to secure the mounting bracket to the support; and
a second attachment device connected to the mounting body opposite the first attachment device, the second attachment device configured to selectively engage either of the other of the upper rail or the lower rail to secure the mounting bracket to the support;
each of the first and second attachment devices including, respectively:
  a first arm configured to extend along and engage with a first side of the corresponding upper or lower rail; and
  a second arm, wherein the second arm includes a bendable tab, configured to extend along and engage with a second side of the corresponding upper or lower rail that is opposite the first side, and
at least one of the first or second attachment devices including a third arm configured to extend along and engage with the first side of the corresponding upper or lower rail, the third arm being spaced laterally apart from the first arm.

* * * * *